United States Patent
Ramakrishnan et al.

(10) Patent No.: US 9,813,072 B2
(45) Date of Patent: Nov. 7, 2017

(54) METHODS AND APPARATUS TO INCREASE AN INTEGRITY OF MISMATCH CORRECTIONS OF AN INTERLEAVED ANALOG TO DIGITAL CONVERTER

(71) Applicant: TEXAS INSTRUMENTS INCORPORATED, Dallas, TX (US)

(72) Inventors: Sthanunathan Ramakrishnan, Bangalore (IN); Sashidharan Venkatraman, Hyderabad (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/145,375

(22) Filed: May 3, 2016

(65) Prior Publication Data

US 2016/0344400 A1   Nov. 24, 2016

(30) Foreign Application Priority Data

May 22, 2015   (IN) .......................... 2557/CHE/2015

(51) Int. Cl.
*H03M 1/06* (2006.01)
*H03M 1/12* (2006.01)
*H03M 1/10* (2006.01)

(52) U.S. Cl.
CPC ........ *H03M 1/0626* (2013.01); *H03M 1/1009* (2013.01); *H03M 1/1215* (2013.01)

(58) Field of Classification Search
CPC .......................... H03M 1/009; H03M 1/1215
USPC .................... 341/118, 120, 155, 143
See application file for complete search history.

(56) References Cited

U.S. PATENT DOCUMENTS

| | | | |
|---|---|---|---|
| 7,782,235 B1* | 8/2010 | Velazquez ........... | H03M 1/1004 341/118 |
| 9,178,525 B2 | 11/2015 | Ramakrishnan et al. | |
| 9,184,762 B2 | 11/2015 | Ramakrishnan et al. | |
| 2007/0099570 A1* | 5/2007 | Gao ........................ | H04B 1/30 455/63.1 |
| 2014/0015703 A1* | 1/2014 | Pullela .................... | H03M 1/50 341/166 |
| 2015/0263749 A1* | 9/2015 | Ramakrishnan ........ | H03M 1/06 341/120 |

* cited by examiner

*Primary Examiner* — Peguy Jean Pierre
(74) *Attorney, Agent, or Firm* — John R. Pessetto; Charles A. Brill; Frank D. Cimino

(57) ABSTRACT

Methods, apparatus, systems and articles of manufacture to increase an integrity of mismatch corrections in an interleaved analog to digital converter are disclosed. An example apparatus includes an instantaneous mismatch estimator that uses an output of an interleaved analog to digital converter to identify a mismatch estimate between two or more component analog to digital converters of the interleaved analog to digital converter. An integrity monitor is to cause the instantaneous mismatch estimator to avoid incorrectly providing the mismatch estimate to a filter, the integrity monitor to instruct the filter to remove the mismatch estimate when the mismatch estimate is detected to be inaccurate.

23 Claims, 15 Drawing Sheets

US 9,813,072 B2

METHODS AND APPARATUS TO INCREASE AN INTEGRITY OF MISMATCH CORRECTIONS OF AN INTERLEAVED ANALOG TO DIGITAL CONVERTER

RELATED APPLICATION

This patent claims priority to Indian Patent Application No. 2557/CHE/2015, which was filed on May 22, 2015 and was entitled "INTEGRITY MONITOR AND CONTROL FOR ROBUST MISMATCH ESTIMATION AND CORRECTION IN AN INTERLEAVED ADC," which is hereby incorporated by reference in its entirety.

FIELD OF THE DISCLOSURE

This disclosure relates generally to interleaved analog to digital converters, and, more particularly, to methods and apparatus to increase an integrity of mismatch corrections of an interleaved analog to digital converter.

BACKGROUND

Analog to digital converters (ADCs) are used to generate a digital representation of a sampled analog signal. To achieve higher sampling rates than can be achieved with a ADC, multiple ADCs are used to sample an analog signal. The digital representations of the analog signal created by the ADCs are then interleaved in the proper order to form a digital representation of the analog signal sampled at a higher sampling rate. In some examples, when the digital representations of each of the ADCs are interleaved, errors are introduced into the digital representations.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
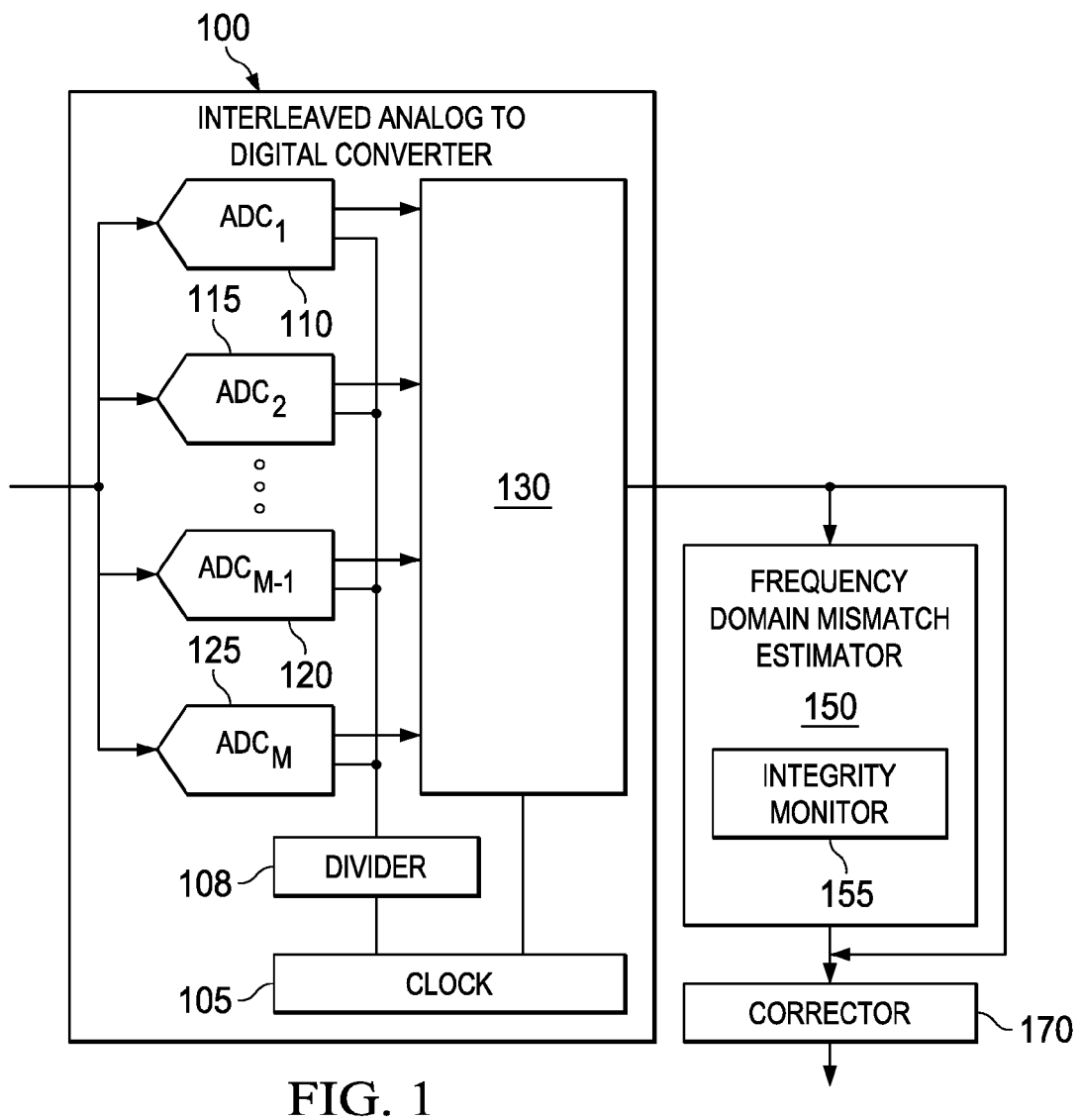
FIG. 1 is a block diagram of an example time-interleaved ADC (TIADC).

FIG. 1 is a block diagram of an example time-interleaved ADC (TIADC) 100. In the illustrated example of FIG. 1, the example TIADC 100 includes a clock 105, a divider 108, ADCs 1 through M 110, 115, 120, 125, and a multiplexer 130. In operation, the divider 108 divides a clock signal provided by the clock 105 (e.g., having a frequency of $F_S$ representing the desired sampling frequency) into M clock signals (e.g., having frequencies of $F_S/M$) that are phase offset from each other. The phase offset clock signals are provided to ADCs 110, 115, 120, 125 to trigger each of the ADCs 110, 115, 120, 125 to generate a digital representation of a received analog signal. The resultant digital signals (or digital representations of the analog signal) created by the ADCs 110, 115, 120, 125 are then interleaved by the multiplexer 130 to create an interleaved representation of the analog signal using a higher sampling rate (e.g., a sampling frequency of $F_S$).

However, in many implementations, each ADC within the interleaved ADC has its own unique characteristics that can cause mis-estimations of the analog value being converted to the digital representation. For example, two ADCs might have slightly differing gain characteristics, timing error characteristics, DC offset characteristics, etc. In some examples, when the digital representations of each of the ADCs are interleaved, errors are introduced. In particular, such errors may manifest themselves as one or more spurs in a resultant frequency spectrum of the digital representation. As used herein, these spurs are referred to as "images" of tones. For example, an offset mismatch between two ADCs sampling a signal at a frequency of $F_S$ will result in an image appearing at $F_S/2$ having a magnitude based on the magnitude of the offset mismatch between the two ADCs.

When additional ADCs are used (and/or other mismatch characteristics are considered), the effects of this phenomenon are amplified.

Examples disclosed herein utilize 4 ADCs in the interleaved ADC 100. However, any number of ADCs may additionally or alternatively be used. In examples disclosed herein, for an input tone at a frequency of $f_0$ and an amplitude of $A_0$, an output of the interleaved ADC will have three images occur due to mismatches between the four ADCs. In such an example, the images of the tone can occur at $f_0+f_s/4$, $f_0+2f_s/4$ and $f_0+3f_s/4$, with respective complex amplitudes of $G_1(f_0)A_0$, $G_2(f_0)A_0$ and $G_3(f_0)A_0$. Based on this information, examples disclosed herein may be used to estimate the three components $G_1(f)$, $G_2(f)$ and $G_3(f)$ for frequencies across a spectrum. The three components can be converted into filter coefficients that can be employed in correction filters to remove the mismatches in the output of the interleaved ADC. Accordingly, the examples disclosed herein may be employed to reduce and/or eliminate the effects of mismatches between the ADCs from the interleaved ADC signal.

In examples disclosed herein, a frequency domain mismatch estimator 150 is used to estimate the effects of mismatches between the ADCs and instruct a corrector to correct those effects (e.g., to estimate the components corresponding to images such as, for example, $G_1(f)$, $G_2(f)$ and $G_3(f)$). However, in blind correction systems, such as the frequency domain mismatch estimator 150 disclosed herein, conditions may exist under which incorrect identifications of the effects of the mismatch(es) can result in degraded performance and/or accuracy of the frequency domain mismatch estimator 150 and/or corrector 170. In examples disclosed herein, the example frequency domain mismatch estimator 150 includes an integrity monitor 155 to remove any mis-estimates due to the blind nature of the estimation algorithm used by the frequency domain mismatch estimator 150. In examples disclosed herein, the integrity monitor 155 monitors mismatch estimates to detect errors and causes those errors to be avoided when possible. When it is not possible to avoid a bad estimate, the example integrity monitor 155 detects the bad estimate, and causes the frequency domain mismatch estimator 150 to correct (e.g., remove) the mis-estimation(s). When it is not possible to remove a bad estimate, the integrity monitor enables the frequency domain mismatch estimator to recover from a bad estimate when good estimates become available. The example frequency domain mismatch estimator 150 and the example integrity monitor 155 are described in further detail in connection with FIG. 2, below.

The example corrector 170 of the illustrated example of FIG. 1 receives the time domain filter coefficients from the example frequency domain mismatch estimator 150 and the output from the interleaved ADC 100. The example corrector 170 utilizes the time domain filter coefficients to modify the values of the output from the interleaved ADC 100. In examples disclosed herein, the example corrector 170 is implemented by a hardware circuit. However, the example corrector 170 may be implemented by any other type circuitry such as, for example, a digital signal processor (DSP). However, the example corrector 170 may be implemented in any other fashion. An example implementation of the example corrector 170 is disclosed in U.S. patent application Ser. No. 14/656,122 entitled MISMATCH CORRECTOR, filed on Mar. 12, 2015 (now U.S. Pat. No. 9,178,525), which is hereby incorporated herein by reference in its entirety.

Figure 2:
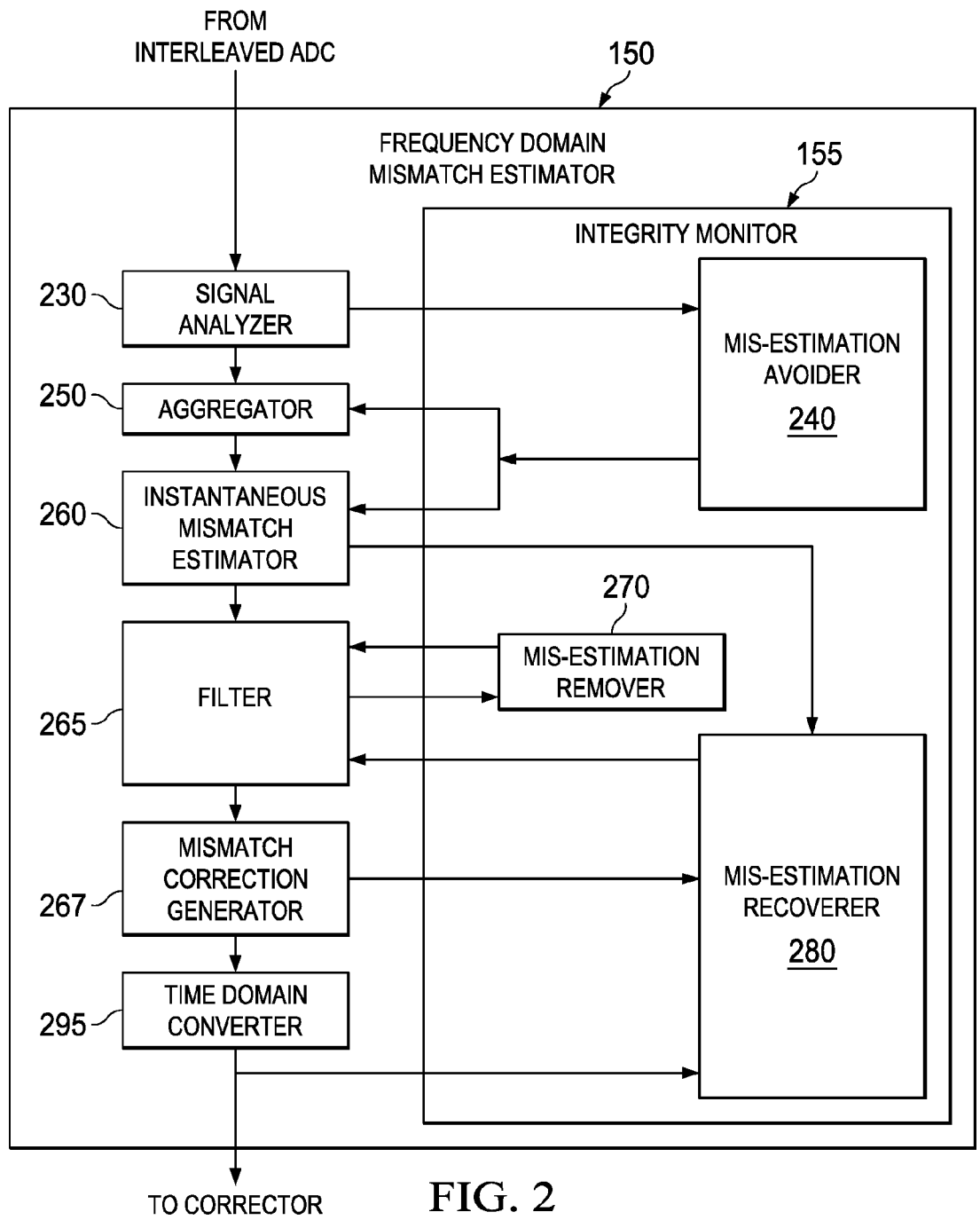
FIG. 2 is a block diagram of an example system constructed in accordance with the teachings of this disclosure to increase an integrity of mismatch corrections of an interleaved ADC.

FIG. 2 is a block diagram of the example frequency domain mismatch estimator 150 of FIG. 1. In examples disclosed herein, the frequency domain mismatch estimator 150 analyzes an output of the interleaved ADC 100 and presents correction instructions to the corrector 170. The corrector 170 uses the correction instructions to remove spurs in the signal resulting from mismatched characteristics of the ADCs of the interleaved ADC 100.

The example frequency domain mismatch estimator 150 of FIG. 2 includes a signal analyzer 230, an aggregator 250, an instantaneous mismatch estimator 260, a filter 265, a mismatch correction generator 267, and a time domain converter 295. The example signal analyzer 230, the example aggregator 250, the example instantaneous mismatch estimator 260, the example filter 265, and the example time domain converter 295 operate to estimate and correct errors in the interleaved ADC signal from the interleaved ADC 100. Example implementations of the example signal analyzer 230, the example aggregator 250, the example instantaneous mismatch estimator 260, the example filter 265, and the example time domain converter 295 are disclosed in U.S. patent application Ser. No. 14/656,205 entitled MISMATCH PROFILE, filed on Mar. 12, 2015 (now U.S. Pat. No. 9,184,762), which is hereby incorporated herein by reference in its entirety.

The example frequency domain mismatch estimator 150 of FIG. 2 includes the integrity monitor 155. In examples disclosed herein, the example integrity monitor 155 is implemented using hardware such as, for example, an integrated circuit (IC), a digital signal processor (DSP), an application specific integrated circuit (ASIC), a field programmable logic device (FPLD), etc. In some examples, due to the blind nature of the estimations performed by the example signal analyzer 230, the example aggregator 250, the example instantaneous mismatch estimator 260, the example filter 265, and the example time domain converter 295, errors in the estimates (referred to herein as mis-estimates) may occur. In examples disclosed herein, the example integrity monitor 155 enables avoidance of the mis-estimates, and, upon detection of the mis-estimates, enables removal of the mis-estimates. In some examples, despite attempting to remove mis-estimates, mis-estimates might still be present. In examples disclosed herein, the example integrity monitor 155 identifies such mis-estimates and attempts to recover from those mis-estimates. The example integrity monitor 155 includes a mis-estimation avoider 240, a mis-estimation remover 270, and a mis-estimation recoverer 280.

The example signal analyzer 230 of the illustrated example of FIG. 2 analyzes an uncorrected ADC signal received from the interleaved ADC 100. The example signal analyzer 230 selects and stores blocks of the signal received from the interleaved ADC 100. In examples disclosed herein, the selection can be periodic, random, or pseudo-random. In examples disclosed herein, the example signal analyzer 230 applies a windowing function and a frequency domain transformation on the selected blocks of the uncorrected ADC signal. In examples disclosed herein, the windowing function is implemented using a Blackman-Harris windowing function. However, any other windowing function may additionally or alternatively be used. In examples disclosed herein, the frequency domain transformation is implemented using a fast Fourier transformation (FFT). However, any other frequency transformation may additionally or alternatively be used. The example signal analyzer 230 provides frequency domain data that characterizes the FFT of the selected blocks of the uncorrected ADC signal to the example aggregator 250 and the example mis-estimation avoider 240 of the example integrity monitor 155. In some examples, the FFT of the selected blocks can be referred to as FFT blocks that characterize the spectral content of the uncorrected ADC signal as a function of contiguous frequency bands referred to as FFT bins.

The example signal analyzer 230 identifies particular FFT bins as corresponding to a signal power, an image power, or an interferer power. For example, the example signal analyzer 230 may identify signal bins as those bins whose power is greater than a signal power threshold, and/or may identify a signal bin as corresponding to an FFT bin with a global maximum power as compared to the remainder of the FFT bins. Typically, the signal bins indicate the frequency location near which an input signal is present. In some examples, the image bin(s) may be identified as those bins at a pre-defined offset from the identified signal-bins (e.g., at offsets of N/4, N/2 or 3N/4, where N represents the total number of FFT bins spanning the sampling frequency) or by comparing a frequency of the FFT bin to a frequency of the signal bin. Typically, the image bins indicate the frequency location near which the Interleaving Images of the input signals are present. In some examples, FFT bin(s) corresponding to an interferer may be identified as FFT bin(s) that are adjacent to a bin identified as an image bin or sometimes within the same bin but separated in frequency from the interleaving image.

Figure 3:
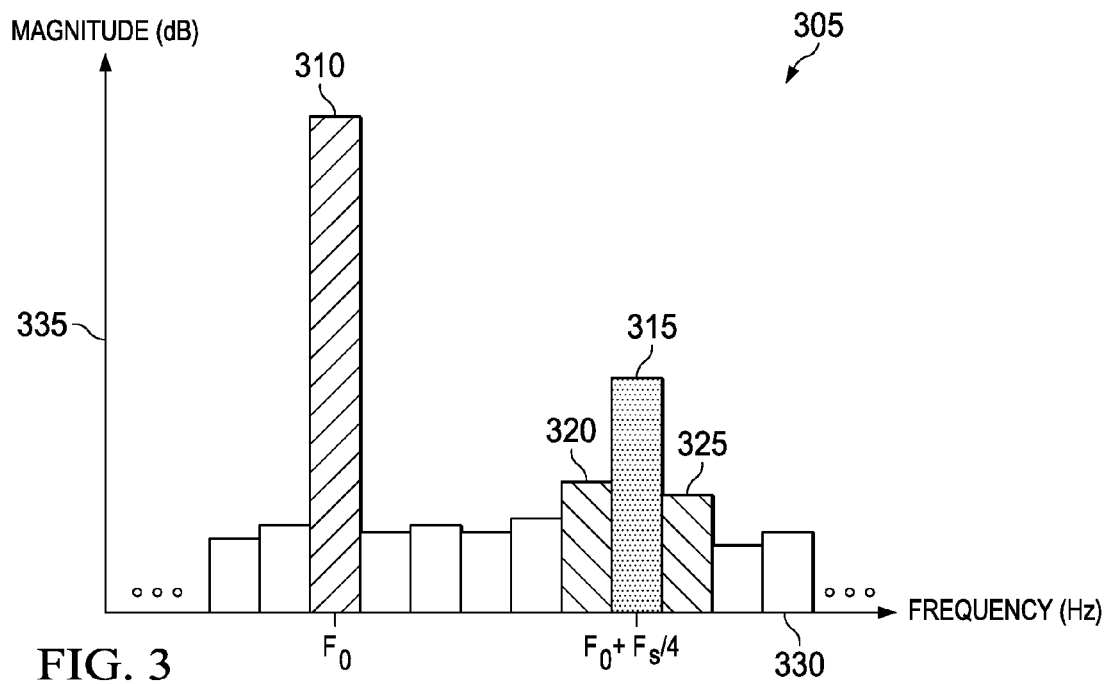
FIG. 3 is a diagram illustrating example identifications of Fast Fourier Transformation (FFT) bins as a signal bin, an image bin, or an interferer bin.

FIG. 3 illustrates an example identification of FFT bins 305 as a signal bin 310, an image bin 315, and interferer bin(s) 320, 325. The example identification of FFT bins 305 includes a horizontal axis 330 representing frequency (in Hz), and a vertical axis 335 representing magnitude in decibels (dB). In the illustrated example of FIG. 3, the signal bin 310 is identified as a result of being a global maximum. However, any other approach to identifying an FFT bin as a signal bin may additionally or alternatively be used. The example image bin 315 is identified based on the frequency of the signal bin plus one quarter of the sampling frequency (Fs) used by the interleaved ADC 100. However, any other approach to identifying the image bin 315 may additionally or alternatively be used. The example interferer bins 320, 325 are identified as being adjacent to the image bin 315. However, any other approach to identification of the interferer bins 320, 325 may additionally or alternatively be used.

Returning to FIG. 2, the example aggregator 250 of the illustrated example of FIG. 2 aggregates correlations between signal and image bin, signal power, image power etc. In examples disclosed herein, the example aggregator 250 aggregates one second of these statistics to form aggregated statistics of the ADC signal. However, any other time period may be used such as, for example one millisecond, one microsecond, five seconds. In examples disclosed herein, the example aggregator 250 of FIG. 2 receives a validity flag from the example mis-estimation avoider 240. The validity flag indicates whether a signal and image pair is valid for estimation.

In some examples, the example aggregator 250 applies a validity check to the FFT bins. In particular, the example aggregator 250 performs a first validity check that compares a power of a given FFT bin to a first threshold, and does not aggregate (e.g., rejects) FFT bins that have a power below the first threshold. As such, the first validity check rejects low power signals and/or mismatches themselves from being processed as valid inputs for estimating the mismatch profile, thereby avoiding possible interferer generated bias.

In examples disclosed herein, the example aggregator 250 performs a second validity check that inspects the validity flag provided by the example mis-estimation avoider 240. In examples disclosed herein, the validity flag indicates whether a corresponding signal and image pair is valid for use in creation of an estimate. In examples disclosed herein, multiple validity flags are provided, each corresponding to a single signal and image pair. However, validity flag(s) corresponding to one or more signal and image pair(s) may be used. If the validity flag indicates that a corresponding signal and image pair is not valid, the signal-image bin can be rejected (i.e., no estimation is needed). For example, if the second validity check fails for a particular signal, $A_0$ and a corresponding image, $G_1A_0$, the signal and image pair $A_0$ and $G_1A_0$ is not provided to the example instantaneous mismatch estimator 260 for inclusion in the preparation of estimates (e.g., the mis-estimation that would have been created is avoided). In examples disclosed herein, the second validity check is performed separately for each signal and image pair (e.g., between $A_0$ and $G_1A_0$, between $A_0$ and $G_2A_0$, and between $A_0$ and $G_3A_0$, etc.) Separate analysis of each signal and image pair accounts for the scenario that there may be an (relatively large) interferer near $G_1A_0$, but not near $G_2A_0$ and/or $G_3A_0$.

The example instantaneous mismatch estimator 260 of the illustrated example of FIG. 2 analyzes the aggregated frequency domain representation generated by the example aggregator 250 to estimate mismatches corresponding to each image bin of the aggregated FFT such that the estimated mismatches can be provided appropriately to the example filter 265 for removing those images (components resulting from different characteristics of the individual ADCs 110, 115, 120, 125 of the interleaved ADC 100). Using the estimated mismatch(es), the example instantaneous mismatch estimator 260 provides a profile of mismatch estimates to the example filter 265.

The example filter 265 of the illustrated example of FIG. 2 accesses the profile identifying the image(s) generated by the instantaneous mismatch estimator 260. In examples disclosed herein, the profile identifies a frequency of each signal and a corresponding estimated magnitude and phase of the mismatch level at each of the images of the signal. The example filter 265 appropriately weights the instantaneous mismatch estimates at each of the signal bins and averages these mismatch estimates over time, thereby forming a filtered mismatch estimate profile. The filter also retains the mismatch estimates at signal bins that are currently not present but were available at some time in the past. The filter also computes an uncertainty for all of the mismatch estimates, that describes the potential error in that mismatch estimate. The filter provides the filtered mismatch estimates to the mismatch correction generator 267 which computes a corresponding mismatch correction parameter for each of the signal bins. This mismatch correction profile is designed such that the interleaving mismatches generated by the interleaved ADC are suppressed effectively. More details of the mismatch correction generator are disclosed in paragraphs 35 and 36 of U.S. patent application Ser. No. 14/656, 122 entitled MISMATCH CORRECTOR, filed on Mar. 12, 2015 (now U.S. Pat. No. 9,178,525), which is hereby incorporated herein by reference in its entirety. The output of the mismatch correction generator 267 is fed to the time domain converter 295 for conversion into filter coefficients to be used in the corrector that can be used to remove the image(s) from the ADC signal. Note that in some examples, the mismatch correction generator may be considered to be substantially a part of time domain convertor. In examples disclosed herein, the example filter 265 receives an instruction from the mis-estimation remover 270 to remove mis-estimations (e.g., bad estimations identified by the example instantaneous mismatch estimator 260) from the profile prior to those mis-estimations having an effect on the frequency domain filter coefficients provided to the time domain converter 295. In examples disclosed herein, the example filter 265 receives an instruction from the mis-estimation recoverer 280 to remove mis-estimations from the profile that have not yet been removed (e.g., by the mis-estimation remover 270), and have already affected a result of the correction. In examples disclosed herein, the instruction(s) received from the example mis-estimation remover 270 and/or the example mis-estimation recoverer 280 cause the example filter 265 to remove individual or set of mismatch estimates from the profile. However, in some examples, the instruction(s) received from the example mis-estimation remover 270 and/or the example mis-estimation recoverer 280 cause the example filter 265 to reset (e.g., remove) all mismatch estimates from the profile.

The example mismatch correction generator 267 converts mismatch estimates from the filter 265 into a frequency domain mismatch correction profile to be provided to the time domain converter 295. The frequency domain mismatch correction profile is provided to the time domain converter 295 and the mis-estimation recoverer 280. For example, a tone (e.g., an image) at $f_0$ produces images at $f_0+fs/4$, $f_0+2fs/4$ and $f_0+3fs/4$ and a tone at $f_0+fs/4$ produces images at $f_0+2fs/4$, $f_0+3fs/4$ and $f_0$ (with aliasing). An example approach for converting mismatch estimates into a frequency domain mismatch correction profile is disclosed in U.S. patent application Ser. No. 14/656,122 entitled MISMATCH CORRECTOR, filed on Mar. 12, 2015 (now U.S. Pat. No. 9,178,525), which is hereby incorporated herein by reference in its entirety.

The example time domain converter 295 of the illustrated example converts the frequency domain mismatch correction profile identified by the mismatch correction generator 267 into time domain coefficients to be provided to the example corrector 170. In examples disclosed herein, the example time domain converter 295 converts the frequency domain mismatch correction profile ($G_k(f)$) into a frequency domain filter response profile ($H_i(f)$) using the equation $$H_i(f) = \sum_{k=0}^{M-1} G_k(f) e^{\frac{j2\pi ik}{M}},$$

k=0 ... M−1, i=1 ... M−1 (M=number of component ADCs used in the interleaved ADC) (refer to U.S. patent application Ser. No. 14/656,122, now U.S. Pat. No. 9,178,525, entitled MISMATCH CORRECTOR for further details on $G_k(f)$ and $H_i(f)$), and then employs an Inverse Fast Fourier Transform (IFFT) to convert the frequency domain filter response ($H_i(f)$) into the time domain. However, any other approach to frequency to time domain conversion may additionally or alternatively be used. The example time domain filter coefficients are provided to the example corrector 170. In examples disclosed herein, the example time domain converter 295 provides the time domain filter coefficients to the mis-estimation recoverer 280 to enable the mis-estimation recoverer 280 to identify mis-estimations that may have already affected the output of the time domain converter 295.

As noted above, the example frequency domain mismatch estimator 150 includes the example integrity monitor 155. The example integrity monitor 155 includes the example mis-estimation avoider 240, the example mis-estimation remover 270, and the example mis-estimation recoverer 280. In other examples, the integrity monitor 155 may include any combination of one or more of the example mis-estimation avoider 240, the example mis-estimation remover 270, and the example mis-estimation recoverer 280.

The example mis-estimation avoider 240 of the illustrated example of FIG. 2 detects conditions that could potentially cause mis-estimates and attempts to avoid generation of such mis-estimates. As noted above, the example aggregator 250 estimates signal to image correlation for signals for which signal to image power ratio exceeds a threshold. Based on the signal to image power ratio, the example mis-estimation avoider 240 determines a validity flag that is used by the example aggregator 250 to determine whether the signal and image pair should be included or excluded from estimation. When interferer power is small, mismatch estimation is accurate. However, in examples disclosed herein, estimation bias can arise when a high powered interferer exists in the image band (e.g., an interferer that could adversely impact estimation of the image).

Figure 9:
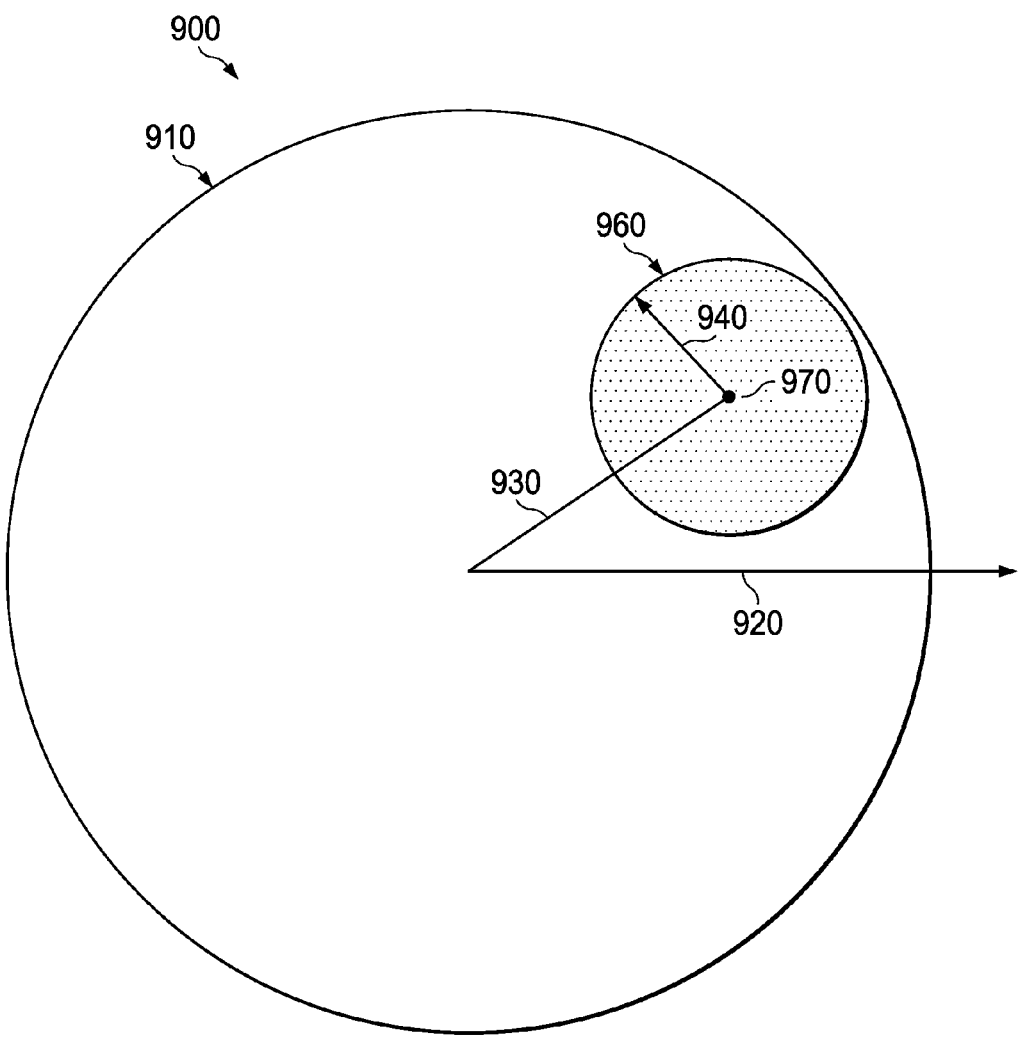
FIGS. 9 and 10 are phasor diagrams illustrating example estimations by the example mismatch estimator of FIG. 2.

FIG. 9 shows an example phasor diagram where a low powered interferer exists very close to the interleaving image such that a signal to image ratio is higher than the threshold. Line 920 represents the signal and line 930 shows the ideal image. If interferer is absent, correlation between signal and image bin would have resulted in a constant value, which after aggregation also would have resulted in the same constant. This constant value indicates the amount of mismatch generated by the signal 920 on the image 930. However, when an interferer is present, represented by line 940, the interferer's component falling on the image bin gets a random phase from one FFT block to another due to randomization of block selection (details disclosed in U.S. patent application Ser. No. 14/656,205 entitled MISMATCH PROFILE, filed on Mar. 12, 2015 (now U.S. Pat. No. 9,184,762), which is hereby incorporated herein by reference in its entirety.). Therefore, the interferer 940 moves around uniformly in the circle 960. Now any individual image bin's result is the sum of the ideal image and the interferer 940 with a changing phase. The correlation of the signal with the image bin's result in any FFT block has an error but when this correlation is aggregated across multiple FFT blocks, the effect of interferer 940 cancels out as the interferer's phase changes uniformly along the circle 960.

Figure 10:
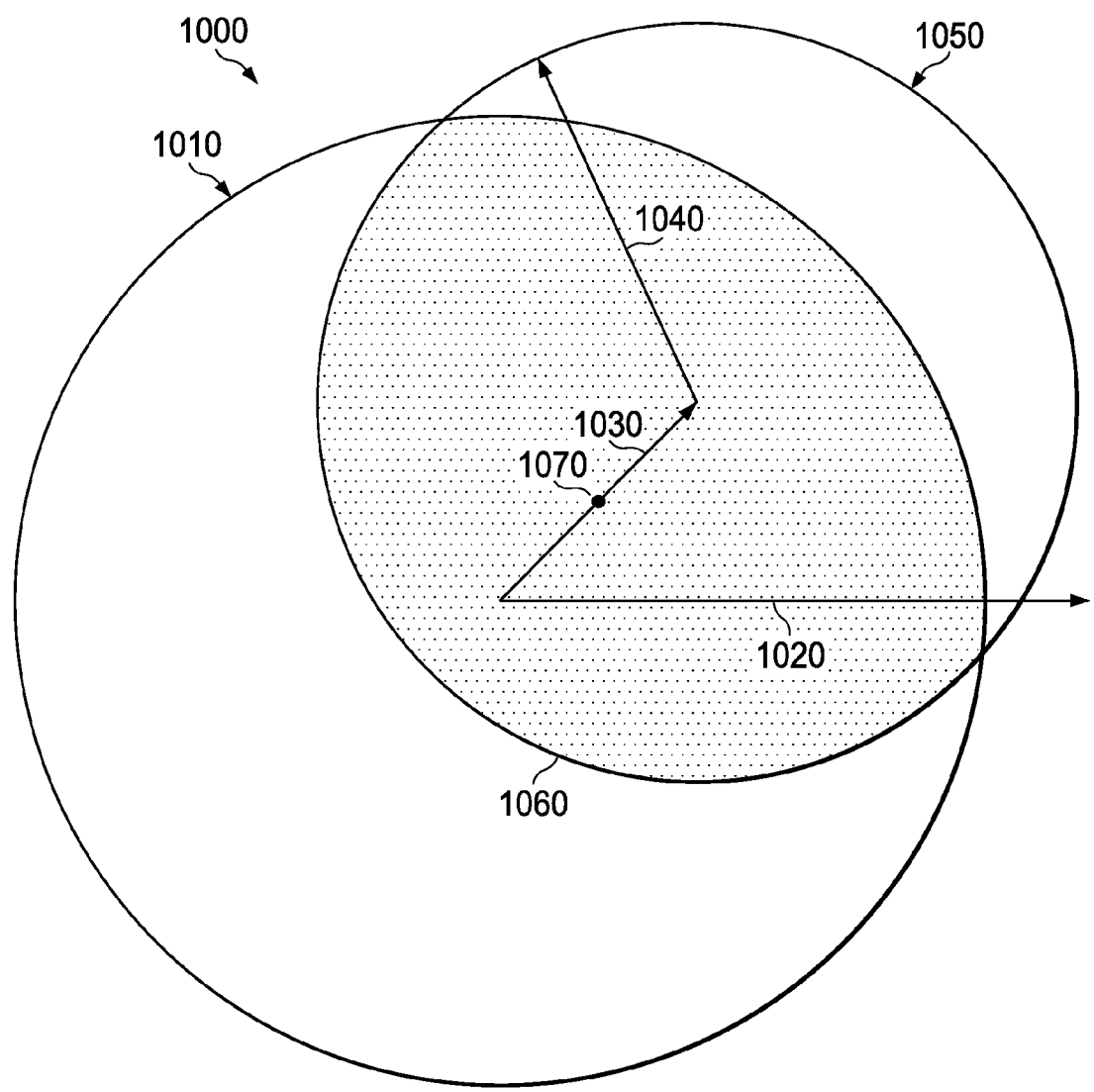

In the illustrated example of FIG. 10, the same operation is shown when interferer power is so large that sometimes the signal to interferer power is lower than the threshold and sometimes higher than the threshold. The threshold is represented by circle 1010. In the illustrated example of FIG. 10, a radius of the circle shows the max power that the image bin can have with respect to the signal 1020. All elements of circle 1050 that are inside circle 1010 are selected by the instantaneous mismatch estimator 260 and all elements of circle 1050 that are outside circle 1010 are rejected by the instantaneous mismatch estimator 260. So after aggregation, the aggregation is not done for all of the circle 1050, thereby resulting in a biased estimate as shown by the point 1070.

Returning to FIG. 2, in examples disclosed herein, the example mis-estimation avoider 240 avoids generation of mis-estimates by comparing a signal power (e.g., a magnitude of the signal bin) to an image power (i.e., a magnitude of the image bin(s)) identified by the signal analyzer 230 and providing the validity flag to the example aggregator 250. In examples disclosed herein, multiple validity flags are provided to the example aggregator 250 corresponding to each signal and image pair. The validity flag(s) ensures that correlation of the signal to image power is done correctly or is not done at all, thereby avoiding mis-estimations.

In examples disclosed herein, hysteresis is used to determine the validity flag. For example, if the signal to image ratio is above a first signal to image ratio threshold, the validity flag is set to indicate that the signal and image pair is valid. In examples disclosed herein, the validity flag is set to a binary one to indicate that the corresponding signal and image pair is valid, and the validity flag is set to a binary zero to indicate that the corresponding signal and image pair is not valid. However, any other approach to indicating validity of a signal and image pair may additionally or alternatively be used. If, for example, the signal to image ratio for the signal and image pair drops below a second signal to image ratio threshold, the example mis-estimation avoider 240 sets the validity flag to indicate that the corresponding signal and image pair is not valid (e.g., a binary zero). In examples disclosed herein, the example mis-estimation avoider 240 does not subsequently identify the signal and image pair as valid until the signal to image ratio exceeds the first signal to image ratio threshold. Selecting between indicating to the example aggregator that the signal and image pair is either valid or not valid ensures that estimations of correction(s) to be performed in association with the signal and image pair performed correctly or not at all.

The example mis-estimation remover 270 of the illustrated example of FIG. 2 analyzes estimates to be filtered by the filter 265 to determine which, if any, of those identified estimates are incorrect (e.g., are mis-estimates). In the illustrated example of FIG. 2, the example mis-estimation remover 270 identifies mis-estimates by comparing estimates to each other to identify whether any of the estimates should be considered outliers and be removed accordingly. The example mis-estimation remover 270 is discussed further in connection with FIG. 4.

The example mis-estimation recoverer 280 of the illustrated example of FIG. 2 provides an instruction(s) to the filter 265 to remove mis-estimations that have already affected the filter 265. In examples disclosed herein, the example mis-estimation recoverer 280 is used to detect poor performance due to old, bad estimates stored in the filter 265. In some examples, bad estimates may corrupt the estimates stored in the filter 265. In the process of conversion of the filtered mismatch estimates to time domain filter coefficients through the time domain converter, bad estimates at some frequency bins can affect even good estimates in other bins. This is because corrector 170 typically has lesser number of taps than the number of bins for which there are estimates, and/or the number of FFT bins in general. This causes some leakage of the bad estimates into all other bins due to equivalent interpolation in the frequency domain. In some examples, bad estimates can cause saturation of the corrector 170, which may impact performance.

To detect such situations, the example mis-estimation recoverer 280 periodically performs a check of the estimates using frequency domain mismatch correction profile provided by the mismatch correction generator 267. In examples disclosed herein, the example mis-estimation recoverer 280 performs the check periodically (e.g., every one hundred milliseconds). However, any other approach to triggering the check performed by the mis-estimation recoverer 280 may additionally or alternatively be used such as, for example, an interrupt, upon calling of another function (e.g., a Kalman filter function), etc. The example mis-estimation recover 280 first identifies a set of currently valid FFT bins. This set is determined as the set of frequencies for which instantaneous estimates are available from the instantaneous mismatch estimator 260 since the last performance check by the mis-estimation recoverer 280. Such an approach enables instances where the set of input frequencies varies rapidly with time to be handled. These set of bins are also called as the Active Tones. The set of bins which do not have any valid inputs since the last performance check are also called as the Inactive Tones.

For each identified FFT bin, the example mis-estimation recoverer 280 computes a mismatch correction. In examples disclosed herein, the mis-estimation recoverer 280 computes the FFT of the time domain filter coefficients at the identified bin, and then converts to G(f) from H(f). For these bins, if the error between the intended mismatch correction and the correction of the mismatch correction generator 267 differs by more than a threshold (e.g., −60 dBc), then the filter 265 is reset for all bins other than the current valid bin set. This ensures that any old bad estimates are reset and that the correction for the current valid bins can be represented properly in the time domain convertor 295. In examples disclosed herein, the filter 265 is reset when a threshold number of mis-estimations are detected. However, any other approach to determining when to reset the filter 265 may additionally or alternatively be used such as, for example, determining a magnitude of a mismatch, the tone index at which a mismatch was detected, etc. In some examples, the example mis-estimation recoverer 280 prevents new estimates from being added to the filter 265 to enable such new estimates to be validated before being added. The example mis-estimation recoverer 280 is discussed in further detail below in connection with FIG. 5.

Figure 4:
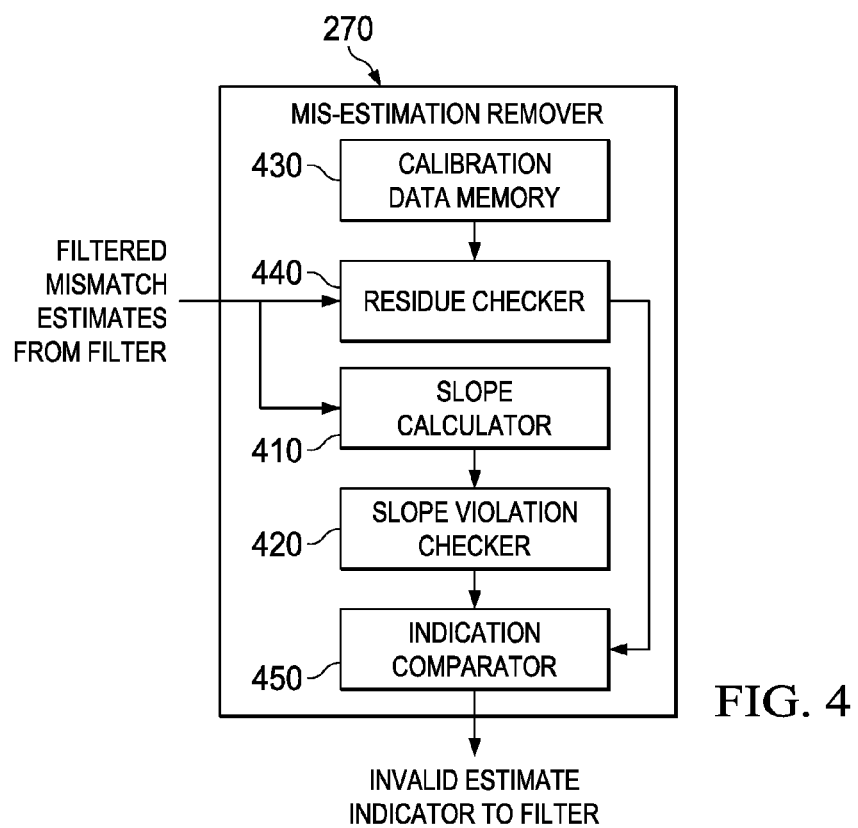
FIG. 4 is a block diagram of the example mis-estimation remover of FIG. 2.

FIG. 4 is a block diagram of the example mis-estimation remover 270 of FIG. 2. In the illustrated example of FIG. 4, the example mis-estimation remover 270 includes a slope calculator 410, a slope violation checker 420, calibration data memory 430, a residue checker 440, and an indication comparator 450.

The example slope calculator 410 of the illustrated example of FIG. 4 accesses mismatch estimates provided by the filter 265. However, in some examples, the example slope calculator 410 may access mismatch estimates provided by the instantaneous mismatch estimator 260. The example slope calculator 410 calculates slopes between the estimates. In the illustrated example, the slope calculation is performed by determining a difference between two estimates, and dividing the difference by a difference between frequencies of the two corresponding estimates. However, any other approach to identifying a slope between two estimates may additionally or alternatively be used. The example slope calculator identifies estimates having slope violations and provides those estimates (e.g., potential mis-estimates) to the example indication comparator 450.

The example slope violation checker 420 of the illustrated example of FIG. 4 compares a magnitude of each slope between estimates (e.g., slopes identified by the slope calculator 410) to a slope threshold. If, for example, there was a drastic change between two adjacent estimates, at least one of those estimates might be the result of a bad estimation (e.g., be a mis-estimate). Comparing slopes between estimates enables identification of mis-estimations for removal. In some examples, the estimate having the maximum number of slope violations (magnitude of slope greater than a threshold) is determined as an invalid estimate. In some examples, an additional requirement of the number of slope violations greater than a threshold may also be added to determine the invalid estimate. Then the process of computation of the slope is again done after removing such an invalid estimate. This process of checking the slope against a threshold is continued iteratively until there are no slope violations or if there are only two estimates left, in which case it is difficult to determine which of the two estimates is invalid. At any time in this process, if two estimates have the same number of slope violations, then the one with higher uncertainty (a measure of the reliability of the estimate— higher the uncertainty, less reliable the estimate) is determined to be the invalid estimate.

The example calibration data memory 430 is implemented by a flash memory (e.g., NAND flash memory). However, the example calibration data memory 430 may be implemented by any other memory structure such as, for example, a Synchronous Dynamic Random Access Memory (SDRAM), Dynamic Random Access Memory (DRAM), RAMBUS Dynamic Random Access Memory (RDRAM), eFUSE and/or any other type of random access memory device. The example calibration data memory 430 of the illustrated example of FIG. 4 stores factory calibration data that is used to identify when an estimate is outside of a normal boundary. In examples disclosed herein, the factory calibration data is stored based on single tone calibrations performed at a time of manufacture. In some examples, the calibration data may be stored as a magnitude and phase for a given frequency and/or range of frequencies. In some examples, the calibration data may be stored as a set of filter coefficients in a frequency domain corresponding to a mismatch estimate.

The example residue checker 440 compares estimates used by the filter 265 to factory calibration data stored in the calibration data memory 430 to identify when the estimate is outside of a normal boundary defined by the calibration data. The example residue checker 440 identifies those estimates falling outside of the normal boundary (e.g., potential mis-estimates) to the example indication comparator 450. The normal boundary which defines the allowed variation in the mismatch estimates from the filter 265 with respect to the calibration data may be a function of the frequency corresponding to the mismatch estimates.

The example indication comparator 450 accesses indications of potential mis-estimates from the example slope violation checker 420 and the example residue checker 440. In examples disclosed herein, the indication comparator 450 identifies when the example slope violation checker 420 and the example residue checker 440 have identified a same estimate as a potential mis-estimate. Such potential mis-estimate is then considered a mis-estimate and an instruction to remove the mis-estimate is transmitted to the example filter 265. In some examples, only the indication of the example slope violation checker 420 or only the indication of the example residue checker 440 or the union of the indication of the example slope violation checker 420 and the indication of the example residue checker 440 may be used to determine a mis-estimate.

Figure 5:
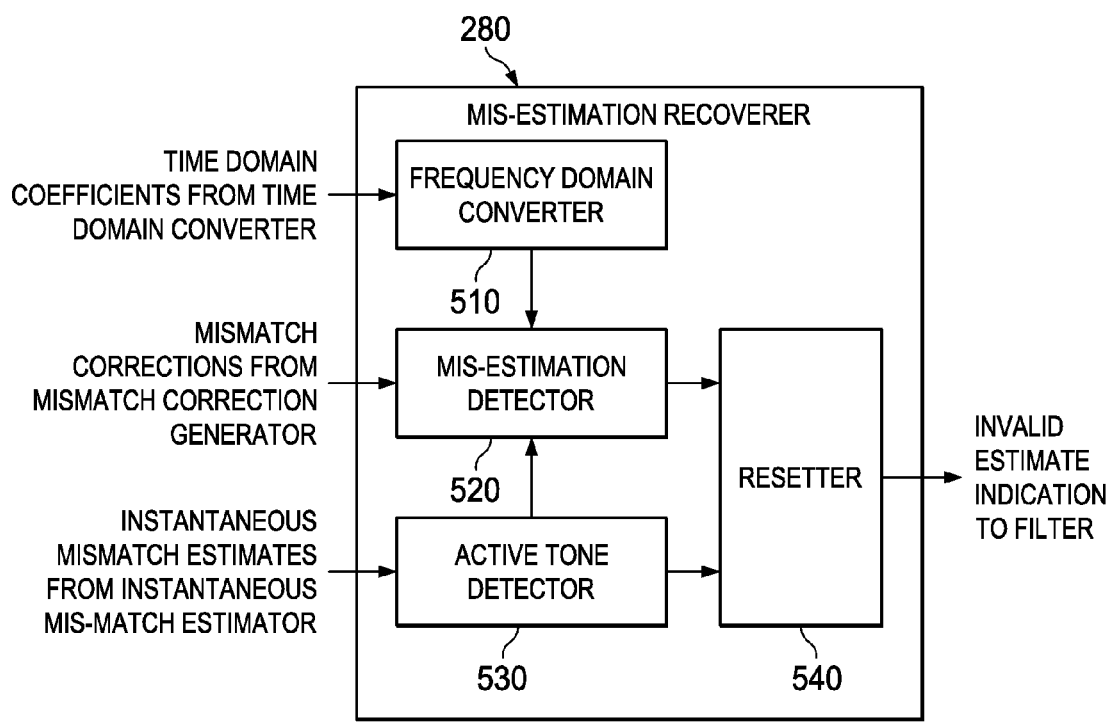
FIG. 5 is a block diagram of the example mis-estimation recoverer of FIG. 2.

FIG. 5 is a block diagram of the example mis-estimation recoverer 280 of FIG. 2. In the illustrated example of FIG. 5, the example mis-estimation recoverer includes a frequency domain converter 510, a mis-estimation detector 520, an active tone detector 530, and a resetter 540.

The example frequency domain converter 510 of the illustrated example of FIG. 5 receives time domain filter coefficients from the example time domain converter 295 and converts the time domain filter coefficients to a frequency domain representation. In examples disclosed herein, the example frequency domain converter 510 implements a fast Fourier transform (FFT) to convert time domain filter coefficients $h_i(n)$ to frequency domain representation $H_i(f)$, i=1, 2, 3 and then converts $H_i(f)$ to mismatch profile $G_k(f)$ using the equation $$G_k(f) = \sum_{i=1}^{M-1} H_i(f) e^{\frac{-j2\pi i k}{M}},$$

k=1 . . . M−1 (M=4 for a 4-interleaved ADC). However, any other approach to converting from the time domain to the frequency domain may additionally or alternatively be used.

The example mis-estimation detector 520 of the illustrated example of FIG. 5 measures differences between frequency domain mismatch corrections provided by the example mismatch correction generator 267 and actual mismatch correction provided by the frequency domain converter 510 for the active estimates identified by the example active tone detector 530. In some examples, the example mis-estimation detector 520 compares the output from the frequency domain converter 510 and the filtered mismatch estimates provided by the filter 265 for estimates identified as active the by active tone detector 530. When the magnitude of the difference between the two profiles exceeds a difference threshold for any of the active tones, the example mis-estimation detector 520 causes the resetter 540 to transmit a reset instruction to the filter 265. This reset instruction indicates all the Inactive tones for which the estimates should be reset by the filter 265.

The example active tone detector 530 of the illustrated example of FIG. 5 receives instantaneous mismatch estimates from the instantaneous mismatch estimator 260. In examples disclosed herein, the input received from the instantaneous mismatch estimator 260 is a mismatch estimate associated with the FFT bin and a validity flag for that estimate indicating whether the estimate is currently valid or not. In examples disclosed herein, the example active tone detector 530 identifies instantaneous estimates which are valid between two calls to the mis-estimation detector 520 as active estimates. This set of active estimates is provided to the mis-estimation detector 530 for comparison against corrections being made by the example filter 265 to be performed for these active estimates alone. The Active Tone Detector also reports the set of inactive estimates (complement of the set of active estimates) to the resetter 540 to enable the resetter to indicate to the filter 265, the set of estimates to be reset when the trigger is received from mis-estimation detector 520.

As noted above, the example mis-estimation recoverer 280 periodically (e.g., once every 100 milliseconds) performs a recovery procedure to determine whether inactive estimates should be removed. In between performance of the recovery procedure, the example active tone detector 530 aggregates instantaneous mismatch estimates from the instantaneous mismatch estimator 260 and considers those mismatch estimates to be active. Frequency bins that are not identified in the aggregated mismatch estimates are considered inactive by the active tone detector 530. In some examples, the example instantaneous mismatch estimator 260 provides mismatch estimates every millisecond. If, for example, the instantaneous mismatch estimator 260 provides mismatch estimates every millisecond and the recovery procedure is performed every one hundred milliseconds, the example active tone detector 530 will aggregate one hundred identifications of mismatch estimates. Upon execution of the recovery procedure, the active tone detector 530 restarts aggregation of the mismatch estimates provided by the instantaneous mismatch estimator 260 (e.g., the aggregated mismatch estimates are deleted).

The example resetter 540 of the illustrated example of FIG. 5 communicates a reset command to the example filter 265. In examples disclosed herein, the example reset command causes the example filter 265 to remove an existing mis-estimation from the filter 265. In some examples, the mis-estimation to be removed from the filter 265 corresponds to the active tone(s) identified as exceeding the difference threshold. In some examples, the resetter 540 causes the example filter 265 to remove inactive estimates identified by the active tone detector 530. In some examples, the reset command provided by the example resetter 540 of the example mis-estimation recoverer 280 serves to remove mis-estimation(s) that is/are identified as inactive by the active tone detector 530. However, in some examples, the example resetter 540 instructs the filter 265 to remove all estimations in an effort to reset the filter 265 to filter signals based on estimates currently identified by the instantaneous mismatch estimator 260.

While an example manner of implementing the example frequency domain mismatch estimator 150 is illustrated in FIG. 2, one or more of the elements, processes and/or devices illustrated in FIG. 2 may be combined, divided, re-arranged, omitted, eliminated and/or implemented in any other way. Further, the example integrity monitor 155, the example signal analyzer 230, the example mis-estimation avoider 240, the example aggregator 250, the example instantaneous mismatch estimator 260, the example filter 265, the example mismatch correction generator 267, the example slope calculator 410, the example slope violation checker 420, the example calibration data memory 430, the example residue checker 440, the example indication comparator 450, and/or, more generally, the example mis-estimation remover 270 of FIGS. 2 and/or 4, the example frequency domain converter 510, the example mis-estimation detector 520, the example active tone detector 530, the example resetter 540, and/or, more generally, the example mis-estimation recoverer 280 of FIGS. 2 and/or 5, the example time domain converter 295, and/or, more generally, the example frequency domain mismatch estimator 150 of FIG. 2 may be implemented by hardware, software, firmware and/or any combination of hardware, software and/or firmware. Thus, for example, any of the example signal analyzer 230, the example mis-estimation avoider 240, the example aggregator 250, the example instantaneous mismatch estimator 260, the example filter 265, the example mismatch correction generator 267, the example slope calculator 410, the example slope violation checker 420, the example calibration data memory 430, the example residue checker 440, the example indication comparator 450, and/or, more generally, the example mis-estimation remover 270 of FIGS. 2 and/or 4, the example frequency domain converter 510, the example mis-estimation detector 520, the example active tone detector 530, the example resetter 540, and/or, more generally, the example mis-estimation recoverer 280 of FIGS. 2 and/or 5, the example time domain converter 295, and/or, more generally, the example frequency domain mismatch estimator 150 of FIG. 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example integrity monitor 155, the example signal analyzer 230, the example mis-estimation avoider 240, the example aggregator 250, the example instantaneous mismatch estimator 260, the example filter 265, the example mismatch correction generator 267, the example slope calculator 410, the example slope violation checker 420, the example calibration data memory 430, the example residue checker 440, the example indication comparator 450, and/or, more generally, the example mis-estimation remover 270 of FIGS. 2 and/or 4, the example frequency domain converter 510, the example mis-estimation detector 520, the example active tone detector 530, the example resetter 540, and/or, more generally, the example mis-estimation recoverer 280 of FIGS. 2 and/or 5, the example time domain converter 295, and/or, more generally, the example frequency domain mismatch estimator 150 of FIG. 2 is/are hereby expressly defined to include a tangible computer readable storage device or storage disk such as a memory, a digital versatile disk (DVD), a compact disk (CD), a Blu-ray disk, etc. storing the software and/or firmware. Further still, the example integrity monitor 155 and/or, more generally, the example frequency domain mismatch estimator 150 of FIG. 2 may include one or more elements, processes and/or devices in addition to, or instead of, those illustrated in FIG. 2, and/or may include more than one of any or all of the illustrated elements, processes and devices.

Flowcharts representative of example machine readable instructions for implementing the example frequency domain mismatch estimator 150 of FIG. 2 are shown in FIGS. 6, 7, 13, 14A, 14B, 15, and/or 16. In these examples, the machine readable instructions comprise a program(s) for execution by a processor such as the processor 1712 shown in the example processor platform 1700 discussed below in connection with FIG. 17. The program(s) may be embodied in software stored on a tangible computer readable storage medium such as a CD-ROM, a floppy disk, a hard drive, a digital versatile disk (DVD), a Blu-ray disk, or a memory associated with the processor 1712, but the entire program and/or parts thereof could alternatively be executed by a device other than the processor 1712 and/or embodied in firmware or dedicated hardware. Further, although the example program is described with reference to the flowchart(s) illustrated in FIGS. 6, 7, 13, 14A, 14B, 15, and/or 16, many other methods of implementing the example frequency domain mismatch estimator 150 may alternatively be used. For example, the order of execution of the blocks may be changed, and/or some of the blocks described may be changed, eliminated, or combined.

As mentioned above, the example processes of FIGS. 6, 7, 13, 14A, 14B, 15, and/or 16 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 6, 7, 13, 14A, 14B, 15, and/or 16 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

Figure 6:
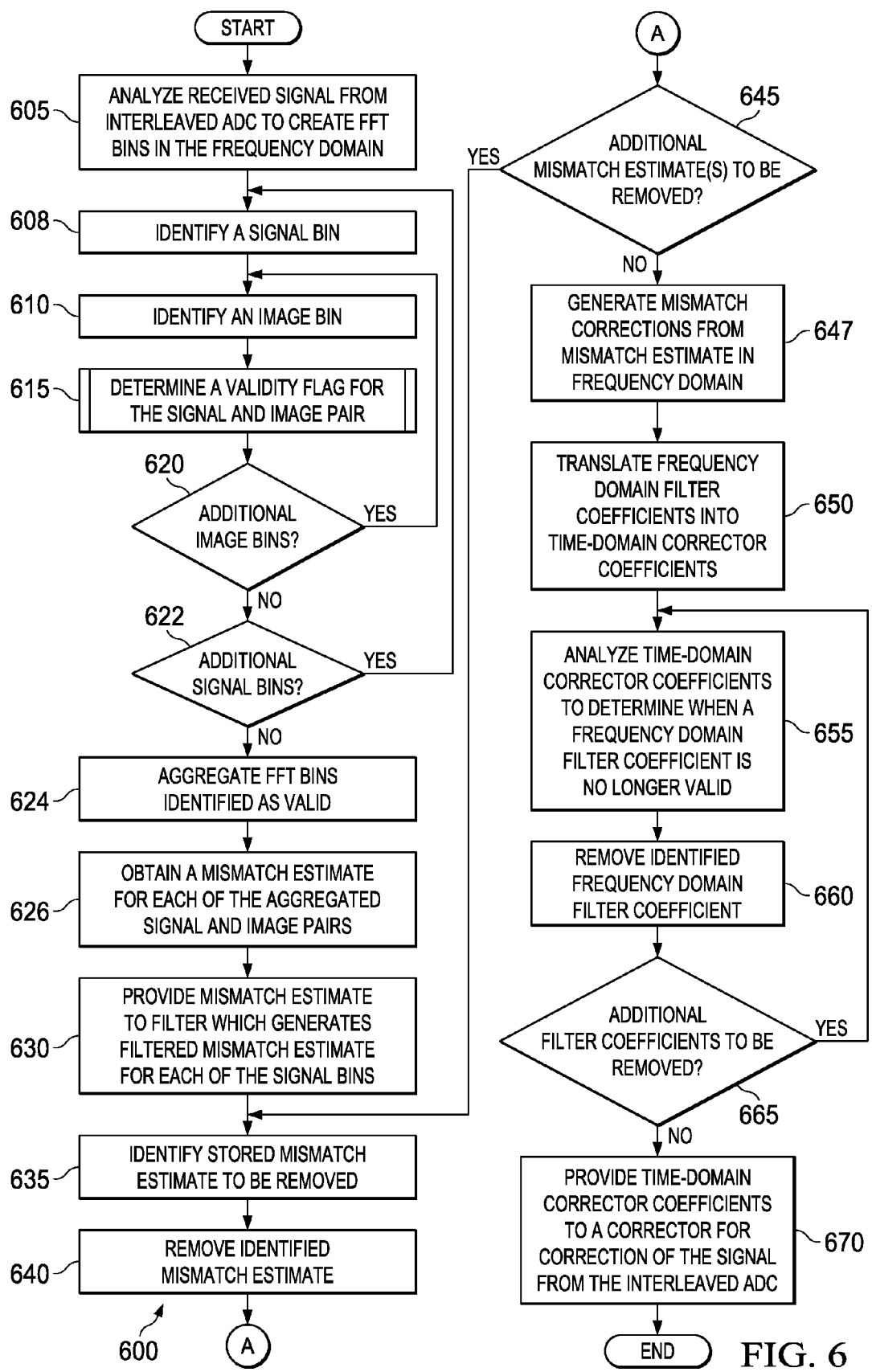
FIG. 6 is a flowchart representing example machine-readable instructions which, when executed, cause the example frequency domain mismatch estimator of FIG. 2 to provide time-domain filter coefficients to the corrector of FIG. 1 to correct the signal provided by the interleaved ADC of FIG. 1.

FIG. 6 is a flowchart representing example machine-readable instructions 600 which, when executed, cause the example frequency domain mismatch estimator 150 to provide time-domain filter coefficients to the corrector 170 of FIG. 2 to correct the signal provided by the interleaved ADC 100 of FIG. 1. The example process 600 of FIG. 6 begins when the example signal analyzer 230 analyzes a received signal from the interleaved ADC 100 to create FFT in the frequency domain (Block 605). In the illustrated example of FIG. 1, the example signal analyzer 230 uses a Fast Fourier Transform (FFT) to generate the FFT bins. In examples disclosed herein, the example signal analyzer 230 identifies a bin(s) as a signal bin (Block 608). In some examples, a signal bin is identified as a bin having a maximum magnitude with respect to other FFT bins generated by the signal analyzer 230 or as a bin having magnitude greater than a threshold. In the illustrated example, a single signal bin is identified. However, in practice, multiple signal bins may be identified.

The example signal analyzer 230 identifies an image bin (Block 610). In examples disclosed herein, the example signal analyzer 230 identifies an image bin by selecting a bin that has a local maximum magnitude, but that is not the same bin as the signal bin (e.g., the signal bin identified in block 608). In some examples, the example signal analyzer 230 selects the image bin based on a frequency of the signal bin and a sampling frequency of the interleaved ADC 100. For example, an $n^{th}$ image bin may be identified at $F_o+n*F_s/m$, where Fo is a frequency of the signal bin, Fs is a sampling frequency of the interleaved ADS 100, m is the number of ADCs in the interleaved ADC 100 (e.g., four ADCs), and n identifies a number identifying the image (e.g., a first image, a second image, a third image, a fourth image, etc.). In examples disclosed herein, a number of images corresponding to a number of ADCs in the interleaved ADC 100 (e.g., four images) are identified. However, any number of image bins may additionally or alternatively be identified.

In association with each identified signal bin and image bin, the example mis-estimation avoider 240 determines a validity flag for the corresponding signal and image pair. (Block 615). An example approach for determining a validity flag for a signal and image pair is disclosed in connection with FIG. 7. The example mis-estimation avoider 240 determines if an additional image bin is associated with the identified signal bin (of block 608) (Block 620). If an additional image bin is associated with the identified signal bin (Block 620 returns a result of YES), the image bin is identified (Block 610) and a validity flag for the signal and image pair is determined (Block 615). The example process repeats until a validity flag corresponding to each signal and image pair is determined.

The example mis-estimation avoider 240 identifies whether any additional signal bins were identified by the signal analyzer 230 (Block 622). If an additional signal bin was identified by the signal analyzer 230 (Block 622 returns a result of YES), the process of blocks 608 through 622 are repeated until no additional signal bins exist (e.g., until Block 622 returns a result of NO).

The example aggregator 240 aggregates samples of the frequency domain representation (i.e., the FFT bins) generated by the signal analyzer 230 for each signal and image pair that are identified as valid (Block 624). In examples disclosed herein, the signal and image pair(s) are identified as valid based on the validity flag identified by the example mis-estimation avoider 240. In some examples, other validity checks may be used to determine whether a particular FFT bin is aggregated such as, for example, a comparison of a magnitude of the FFT bin against a threshold magnitude. In examples disclosed herein, the example aggregator 250 aggregates one second of the frequency domain representation (i.e., the frequency bins) for valid bins to form an aggregated frequency domain representation (i.e., aggregated frequency bins) of the ADC signal. However, any other time period may be used such as, for example one millisecond, one microsecond, five seconds, etc.

The example instantaneous mismatch estimator 260 processes the aggregated frequency domain representation to obtain a mismatch estimate for each of the aggregated signal and image pairs in the aggregated frequency domain representation (Block 626). By virtue of the validity flag excluding particular signal and image pairs where the signal and image pair was likely to produce a mis-estimate, mis-estimations of mismatch estimates determined in block 626 are avoided.

The example instantaneous mismatch estimator 260 provides mismatch estimates for each identified image bin as frequency domain mismatch estimates to the example filter 265 (Block 630). The example filter 265 filters the mismatch estimates and stores the mismatch estimates, so that the filtered mismatch estimates can be provided to the corrector 170 via the time-domain converter 295. In some examples, despite having attempted to avoid mis-estimates, the example instantaneous mismatch estimator 260 may incorrectly provide a mismatch estimate to the filter 265 indicative of a correction to be made to the signal from the interleaved ADC 100. The example mis-estimation remover 270 identifies stored mismatch estimates to be removed from the example filter 265 (Block 635). An example approach to identifying estimates to be removed from the example filter 265 is disclosed in connection with FIGS. 13, 14A, 14B, and/or 15. The example mis-estimation remover 270 identifies mis-estimations to be removed and sends a reset command to the filer 265 instructing the filter 265 to remove identified mis-estimations (Block 640). The filter 265 removes the identified mis-estimations from the stored filtered mismatch estimates. The example mis-estimation remover 270 determines whether any other estimations identified by the example instantaneous mismatch estimator 260 should be removed (Block 645). If additional estimations exist for removal (e.g., if Block 645 returns a result of YES), the example process of Blocks 635 through 645 repeats until no additional estimations (e.g., mis-estimations) exist for removal (e.g., until Block 645 returns a result of NO). The example mismatch correction generator 267 generates mismatch corrections as frequency domain filter coefficients based on the mismatch estimates. (Block 647).

The example mismatch correction generator 267 provides the frequency domain filter coefficients (e.g., a profile of corrections) to the time domain converter 295 such that the time domain converter 295 can convert the frequency domain filter coefficients into time-domain filter coefficients (Block 650). Despite having attempted to avoid any mis-estimates, as well as remove any detected mis-estimates, mis-estimates may still remain and may affect the time domain filter coefficients. The example mis-estimation recoverer 280 analyzes the time domain filter coefficients of the time domain converter 295 to determine whether a frequency domain filter coefficient is no longer valid (Block 655). An example approach to determining whether a frequency domain filter coefficient is no longer valid is disclosed in connection with FIG. 16. In some examples, a frequency domain filter coefficient (e.g., an estimation) may be stored in the filter 265 that is no longer representative of images produced as a result of mismatches between the ADCs of the interleaved ADC 100. This may be because, for example, the mismatch characteristics of the ADCs has changed (e.g., the mismatch characteristics may be based on temperature), the signal sampled by the interleaved ADC 100 has changed, etc.

The example mis-estimation recoverer 280 instructs the filter 265 to remove the frequency domain mismatch estimates that are identified no longer being valid from the profile (Block 660). In examples disclosed herein, the example mis-estimation recoverer 280 identifies particular filter coefficients to be removed from the profile maintained by the filter 265. In some examples, the example mis-estimation recoverer 280 transmits a reset signal that causes the example filter 265 to remove all stored filter coefficients and restart the filtering based on filter coefficients provided by the instantaneous mismatch estimator 260 (e.g., begin creation of a new profile). The example mis-estimation recoverer 280 determines whether there are any additional filter coefficients to be removed (Block 665). If additional filter coefficients are to be removed (e.g., Block 665 returns a result of YES), the example process of blocks 655 through 665 is repeated until no additional filter coefficients are to be removed (e.g., until Block 665 returns a result of NO).

The example time domain converter 295, based on frequency domain coefficients provided by the example filter 265, provides time-domain filter coefficients to the corrector 170 for correction of the signal from the interleaved ADC 100 (Block 670).

In the illustrated example of FIG. 6, the example process 600 is represented as a serial process. However, in some example implementations, portions of the example process may be implemented in parallel. For example, the example instantaneous mismatch estimator 260 may continuously identify mismatch estimates based on information from the example signal analyzer 230, the example mis-estimation avoider 240, and/or the example aggregator 250, and provide the mismatch estimates to the filter 265. Meanwhile, the example mis-estimation remover 270 may monitor mis-estimations provided to the filter 265 to remove mis-estimations that are in error prior to those mis-estimations having an effect on the corrections performed by the corrector 170. Likewise, the example mis-estimation recoverer 280 may monitor instructions provided to the corrector 170 by the time-domain converter 295 to identify erroneous filtering instructions and cause corresponding mis-estimations to be removed at the filter 265.

Figure 7:
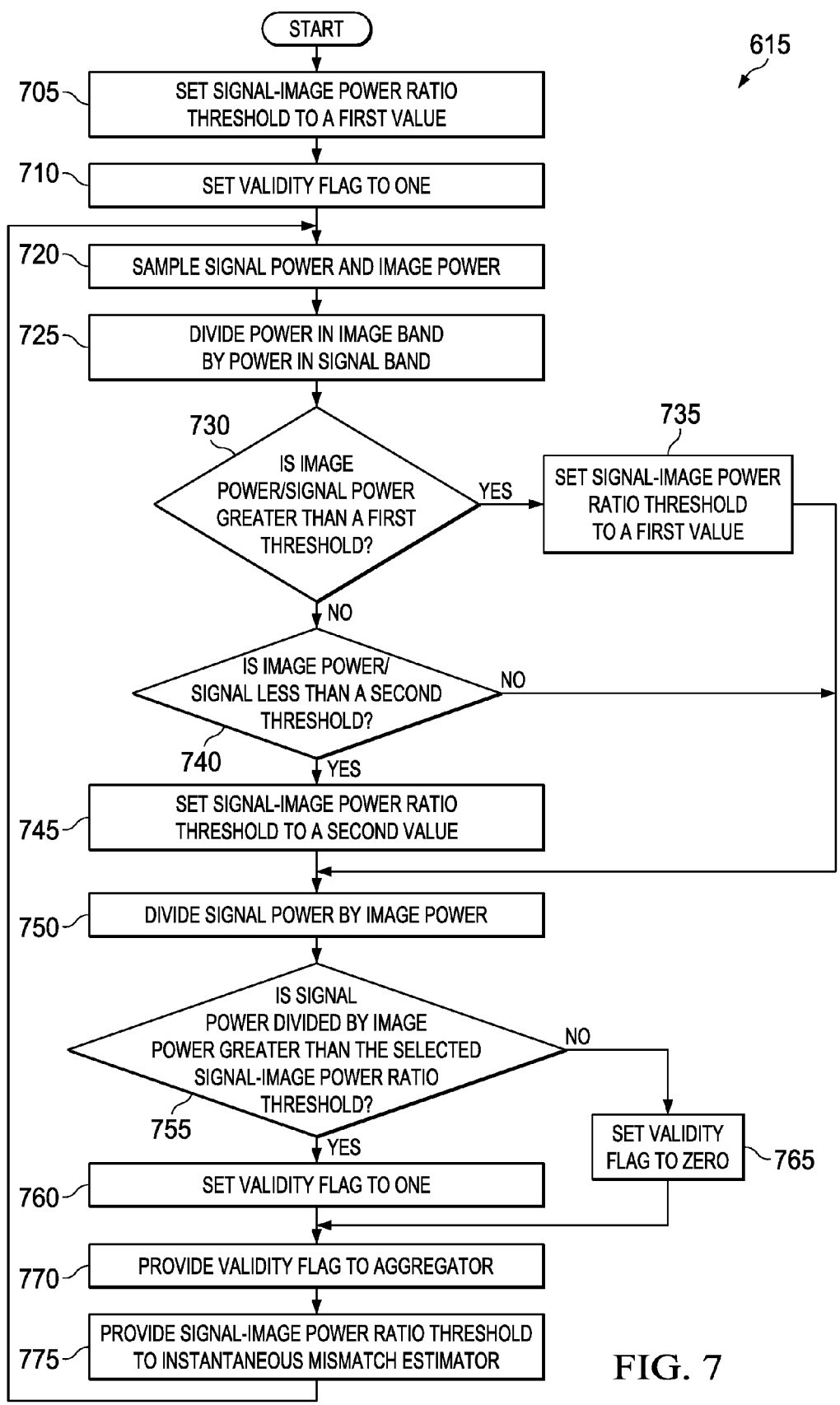
FIG. 7 is a flowchart representing example machine-readable instructions which, when executed, cause the example mis-estimation avoider of FIG. 2 to select a signal to image power threshold for use in association with estimation of a gain correction for a given image bin.
Figure 8:
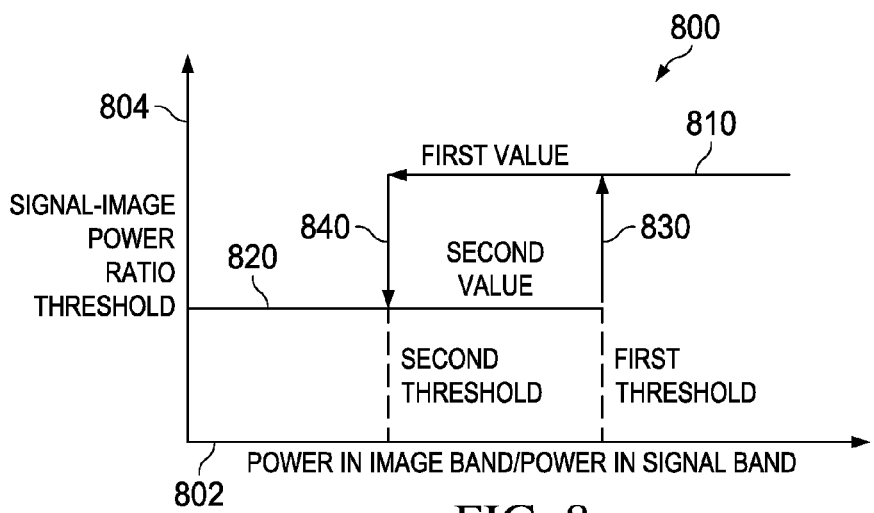
FIG. 8 is a diagram illustrating transitions between a first signal-image power ratio threshold and a second signal-image power ratio threshold in connection with the machine-readable instructions of FIG. 7.

FIG. 7 is a flowchart representing example machine-readable instructions 615 which, when executed, cause the example mis-estimation avoider 240 of FIG. 2 to provide a validity flag to the example aggregator 250 for a given signal and image pair and a signal to image power ratio threshold to the instantaneous mismatch estimator 260. FIG. 8 is a diagram 800 illustrating transitions between a first signal-image power ratio threshold 810 and a second signal-image power ratio threshold 820 in connection with the machine-readable instructions of FIG. 7. The horizontal axis 802 of the diagram 800 of FIG. 8 represents a ratio of power in an image band divided by power in a signal band. The vertical axis 804 of the diagram 800 of FIG. 8 represents a signal-image power ratio threshold.

The example program of FIG. 7 begins when the example mis-estimation avoider 240 initializes itself by setting a signal-image power ratio threshold to a first value (Block 705). The example mis-estimation avoider 240 sets a validity flag to a binary one to represent that the identified signal and image pair is valid (Block 710). In examples disclosed a binary one is used to represent a valid signal and image pair, while a binary zero is used to represent an invalid signal and image pair. However, any other approach to identifying a signal and image pair as valid or invalid may additionally or alternatively be used.

The example mis-estimation avoider 240 samples a signal power and an image power corresponding to the selected signal and the selected image from the signal analyzer 230 (Block 720). The example mis-estimation avoider 240 divides a power of the image band by a power of the signal band. (Block 725). The example mis-estimation avoider 240 determines whether the image power divided by the signal power is greater than a first threshold 830. (Block 730). If the image power divided by the signal power is greater than the first threshold 830 (Block 730 returns a result of YES), the example mis-estimation avoider 240 sets the signal-image power ratio threshold to the first value 810 (Block 735).

If the image power divided by the signal power is not greater than the first threshold 830 (Block 730 returns a result of NO), the example mis-estimation avoider 240 determines whether the image power is less than a second threshold 840 (Block 740). In examples disclosed herein, the example first threshold 830 is greater than the example second threshold 840. If the image power divided by the signal power is less than the second threshold 840 (Block 740 returns a result of YES), the example mis-estimation avoider 240 sets the signal-image power ratio threshold to a second value 820 (Block 745). If the image power divided by the signal power is not less than the second threshold (Block 740 returns a result of NO), the selected signal-image power ratio threshold is not changed. In examples disclosed herein, the example first value 810 for the signal-image power ratio threshold is greater than the example second value 820 for the signal-image power ratio threshold. As a result, when the image power divided by the signal power is high (e.g., there is a high probability that there will be a mis-estimate), a higher signal-image power ratio threshold is used. Conversely, when the image power divided by the signal power is low (e.g., there is a low probability that there will be a mis-estimate), a lower signal-image power ratio threshold is used.

The example mis-estimation avoider 240 divides the signal power by the image power (Block 750). The example mis-estimation avoider 240 determines whether the signal power divided by the image power (as calculated in connection with block 750) is greater than the selected signal-image power ratio threshold (e.g., the first value 810 or the second value 820) (Block 755). If the signal power divided by the image power is greater than the selected signal-image power ratio threshold (e.g., Block 755 returns a result of YES), the example mis-estimation avoider 240 sets the validity flag to a binary one to represent that the identified signal and image pair is valid (Block 760). If the signal power divided by the image power is not greater than the selected signal-image power ratio threshold (e.g., Block 755 returns a result of NO), the example mis-estimation avoider 240 sets the validity flag to a binary zero to represent that the identified signal image pair is not valid (Block 765). The example mis-estimation avoider 240 provides the validity flag to the example aggregator 250 (Block 770). The example aggregator 250 uses the validity flag to determine whether the signal and image pair should be aggregated. The example mis-estimation avoider 240 also provides the signal-image power ratio threshold to the example instantaneous mismatch estimator 260 (Block 775). The example instantaneous mismatch estimator 260 uses the signal-image power ratio threshold to create unbiased estimates. The example process of blocks 720 through 775 is repeated to continually provide the example aggregator 250 with validity flag(s) to enable the example aggregator 250 to include or exclude images in the aggregated frequency domain representation provided to the instantaneous mismatch estimator 260. In some examples, multiple instances of the example process 615 of FIG. 7 are implemented corresponding to different signal and image pairs identified by the example signal analyzer 230.

In the illustrated example of FIG. 7, the example mis-estimation avoider 240 uses hysteresis to select the signal-image power ratio threshold. That is, the first signal to image power ratio threshold 810 is selected when the image power divided by the signal power is greater than a first threshold 830, and the second signal to image power ratio threshold 820 is selected when the image power divided by the signal power is less than a second threshold 840. Such an approach results in a hysteresis, whereby when the image power divided by the signal power is between the first threshold 830 and the second threshold 840, the selection of the first signal-image power ratio threshold 810 or the second signal-image power ratio threshold 820 is unchanged. However, any other approach to selecting the signal-image power ratio threshold may additionally or alternatively be used. Moreover, other inputs may additionally or alternatively be used to determine the example signal to image power threshold such as, for example, an interferer power.

As noted above, FIGS. 9 and 10 are phasor diagrams. FIG. 9 is a phasor diagram 900 illustrating an example where an interferer power is low. FIG. 10 is a phasor diagram 1000 illustrating an example where an interferer power is high. While in the illustrated examples of FIGS. 9 and/or 10 phasor diagrams are used to represent estimation of a mismatch, any other approach and/or representation may be additionally or alternatively used.

The example phasor diagram 900 of FIG. 9 includes a signal to image threshold 910. In examples disclosed herein, the example signal to image threshold 910 is based on the threshold provided by the mis-estimation avoider 240 of FIG. 2. In the illustrated example of FIG. 9, the signal to image threshold 910 is represented as a circle. However, the signal to image threshold 910 may be represented in any other fashion (e.g., as an ellipse, as a square, as a rectangle, etc.). The example phasor diagram 900 includes a signal phasor 920, an image phasor 930, and an interferer phasor 940. In the illustrated example of FIG. 9, the example image phasor 930 and the example interferer phasor 940 are used to generate a region 950. In the illustrated example of FIG. 9, the example region 950 exists entirely within the signal to image threshold 910 and, accordingly, there is a total overlap. The example instantaneous mismatch estimator 260 identifies a center 970 of the overlap 960, and estimates the magnitude of the correction using a distance from an origin of the phasor diagram 900 to the center 970.

The example phasor diagram 1000 of FIG. 10 includes a signal to image threshold 1010. In examples disclosed herein, the example signal to image threshold 1010 is based on the threshold provided by the mis-estimation avoider 240 of FIG. 2. In contrast to the example phasor diagram 900 of FIG. 9, the signal to image threshold 1010 of FIG. 10 results in a biased estimate. In the illustrated example of FIG. 10, the signal to image threshold 1010 is represented as a circle. However, the signal to image threshold 1010 may be represented in any other fashion (e.g., as an ellipse, as a square, as a rectangle, etc.). The example phasor diagram 1000 includes a signal phasor 1020, an image phasor 1030, and an interferer phasor 1040. In the illustrated example of FIG. 10, the example image phasor 1030 and the example interferer phasor 1040 are used to generate a region 1050. The example aggregator identifies an overlap 1060 between the region 1050 and the signal to image threshold 1010. In the illustrated example of FIG. 10, there is a partial overlap between the example region 1050 and the example signal to image threshold 1010. A center 1070 of the overlap 1060 is identified by selecting elements of the example region 1050 within the threshold 1010, and rejecting elements of the example region 1050 outside of the threshold 1010. The magnitude of the correction is determined using a distance from an origin of the phasor diagram 1000 to the center 1070. Accordingly, when a magnitude of the example interferer phasor 1040 is large enough to cause part of the region 1050 to fall outside of the signal to image threshold 1010, the example estimate is identified as having a magnitude matching the example center 1070 which is different from the ideal center, thereby creating a biased estimate. By, for example, using varying signal to image thresholds (e.g., the first signal to image threshold value 810, the second signal to image threshold value 820), the mis-estimation avoider 240 causes a good estimate to be identified, or in the event of a strong interferer, a biased estimate to be created that increases accuracy of the estimator and, ultimately, the corrections applied by the frequency domain mismatch estimator 150.

Figure 11:
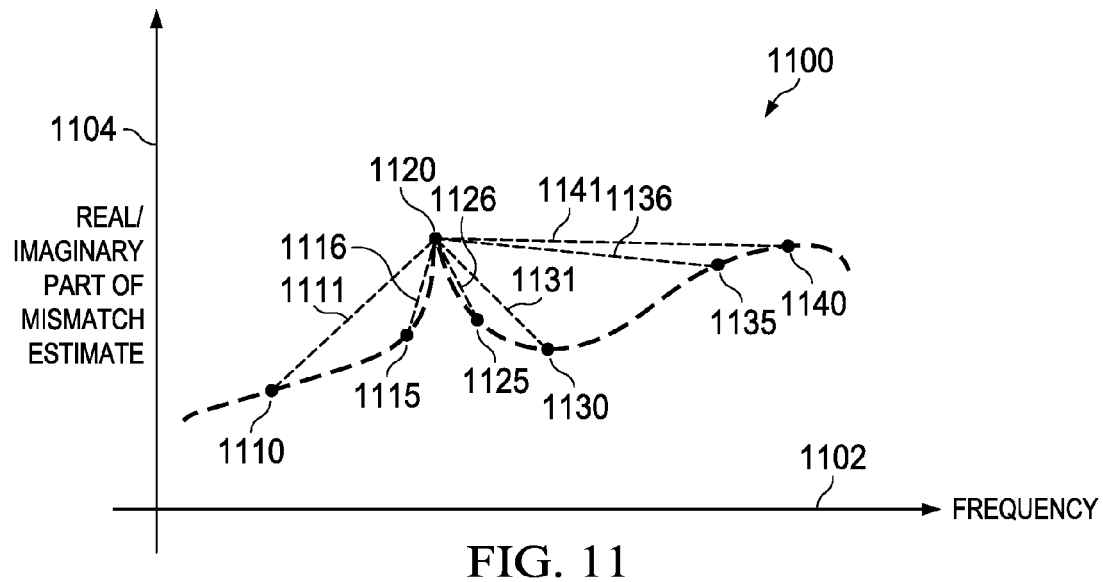
FIG. 11 is a diagram illustrating a slope validation performed on the estimates to identify a potential mis-estimate.
Figure 12:
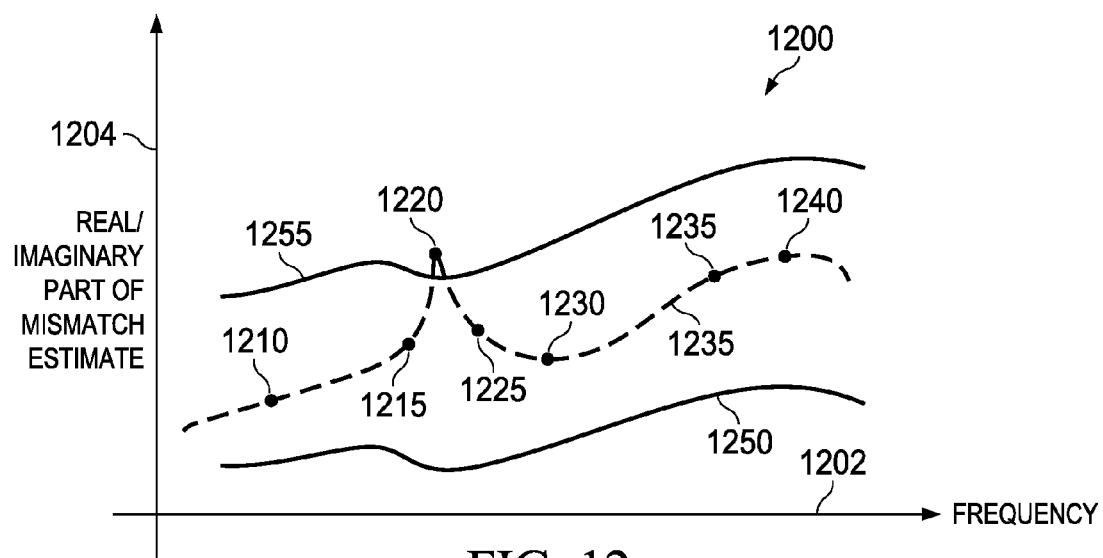
FIG. 12 is a diagram illustrating a residue validation performed on the estimates to identify a potential mis-estimate

FIGS. 11 and 12 are diagrams illustrating example estimates. FIG. 11 is a diagram 1100 illustrating a slope validation performed on the estimates to identify a potential mis-estimate. The example diagram 1100 of FIG. 11 includes a horizontal axis 1102 representing a frequency at which the estimate was identified. The example diagram 1100 of FIG. 11 includes a vertical axis 1104 representing a real and/or imaginary part of the mismatch estimate. The example diagram 1100 of FIG. 11 includes a first estimate 1110, a second estimate 1115, a third estimate 1120, a fourth estimate 1125, a fifth estimate 1130, a sixth estimate 1135, and a seventh estimate 1140. While in the illustrated example of FIG. 11 seven estimates are represented, any number of estimates may additionally or alternatively be used. The illustrated example of FIG. 11 includes slopes 1111, 1116, 1126, 1131, 1136, 1141 between the third estimate 1120 and each of the first estimate 1110, the second estimate 1115, the fourth estimate 1125, the fifth estimate 1130, the sixth estimate 1135, and the seventh estimate 1140. The slopes are used by the example mis-estimation remover 270 to identify potential mis-estimates for removal.

FIG. 12 is a diagram 1200 illustrating a residue validation performed on the estimates to identify a potential mis-estimate. The example diagram 1200 of FIG. 12 includes a horizontal axis 1202 representing a frequency at which the estimate was identified. The example diagram 1200 of FIG. 12 includes a vertical axis 1204 representing a real and/or imaginary part of the mismatch estimate. The example diagram 1200 of FIG. 12 includes a first estimate 1210, a second estimate 1215, a third estimate 1220, a fourth estimate 1225, a fifth estimate 1230, a sixth estimate 1235, and a seventh estimate 1240. While in the illustrated example of FIG. 12 seven estimates are represented, any number of estimates may additionally or alternatively be used. The example diagram 1200 of FIG. 12 includes a low threshold curve 1250 and a high threshold curve 1255. The low threshold curve 1250 and the high threshold curve 1255 represent factory calibration thresholds that indicate an acceptable amount of mis-estimation. If, for example, an estimate falls outside of the boundary between the low threshold curve 1250 and the high threshold curve 1255 (e.g., see the third example estimate 1220), the estimate may be considered a potential mis-estimate.

Figure 13:
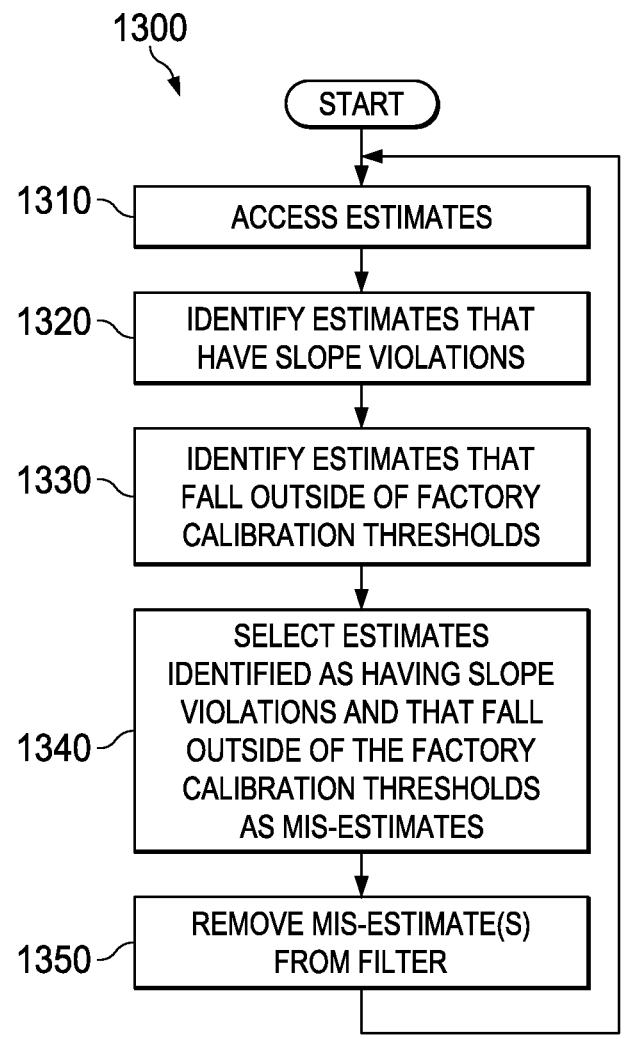
FIG. 13 is a flowchart representative of example machine-readable instructions which, when executed, cause the example mis-estimation remover of FIG. 2 to identify estimates as mis-estimates for removal.

FIG. 13 is a flowchart representative of example machine-readable instructions which, when executed, cause the example mis-estimation remover 270 of FIG. 2 to identify estimates as mis-estimates for removal. The example program 1300 of FIG. 13 begins when the example slope calculator 410 and/or the example residue checker 440 access estimates to be used by the example filter 265 (Block 1310). The example slope calculator 410 and/or the example slope violation checker 420 identify estimates that have slope violations as potential mis-estimates (Block 1320). An example procedure for identifying estimates that have slope violations as potential mis-estimates is described in further detail in connection with FIGS. 14A and 14B.

The example residue checker 440 identifies estimates that fall outside of a factory calibration threshold(s) as potential mis-estimates (Block 1330). An example procedure for identifying estimates that fall outside of the factory calibration thresholds as potential mis-estimates is described in further detail in connection with FIG. 15.

In the illustrated example of FIG. 13, the example indication comparator 450 identifies when the example slope violation checker 420 and the example residue checker 440 have identified a same estimate as a potential mis-estimate. Estimates that are identified as potential mis-estimates as a result of both the slope check and the factory calibration check are identified as mis-estimates (Block 1340). That is, a logical AND of estimates having a slope violation and estimates falling outside of the factory calibration threshold is used to identify mis-estimates. However, any other approach for identifying mis-estimates may additionally or alternatively be used. For example, a logical OR of estimates having a slope violation or falling outside of the factory calibration threshold may be used to identify mis-estimates. Those estimates identified as mis-estimates are then provided to the example filter 265 (Block 1350). The example process 1300 of FIG. 13 is then continually repeated to provide accurate indications of mis-estimates to the filter 265.

Figure 14A:
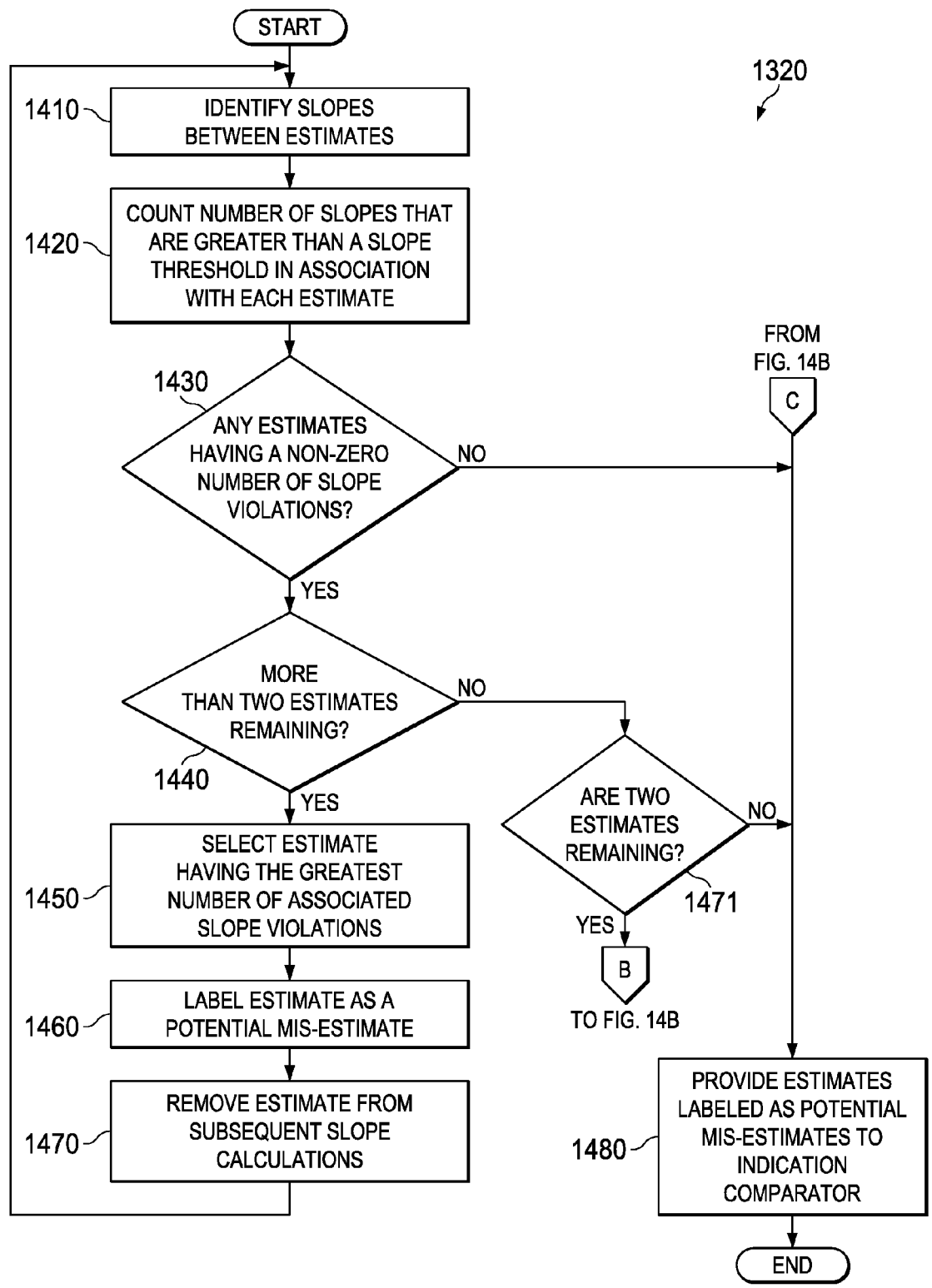
FIGS. 14A and 14B are a flowchart representative of example machine-readable instructions which, when executed, cause the example mis-estimation remover of FIG. 2 to identify estimates as potential mis-estimates based on a slope validation.
Figure 14B:
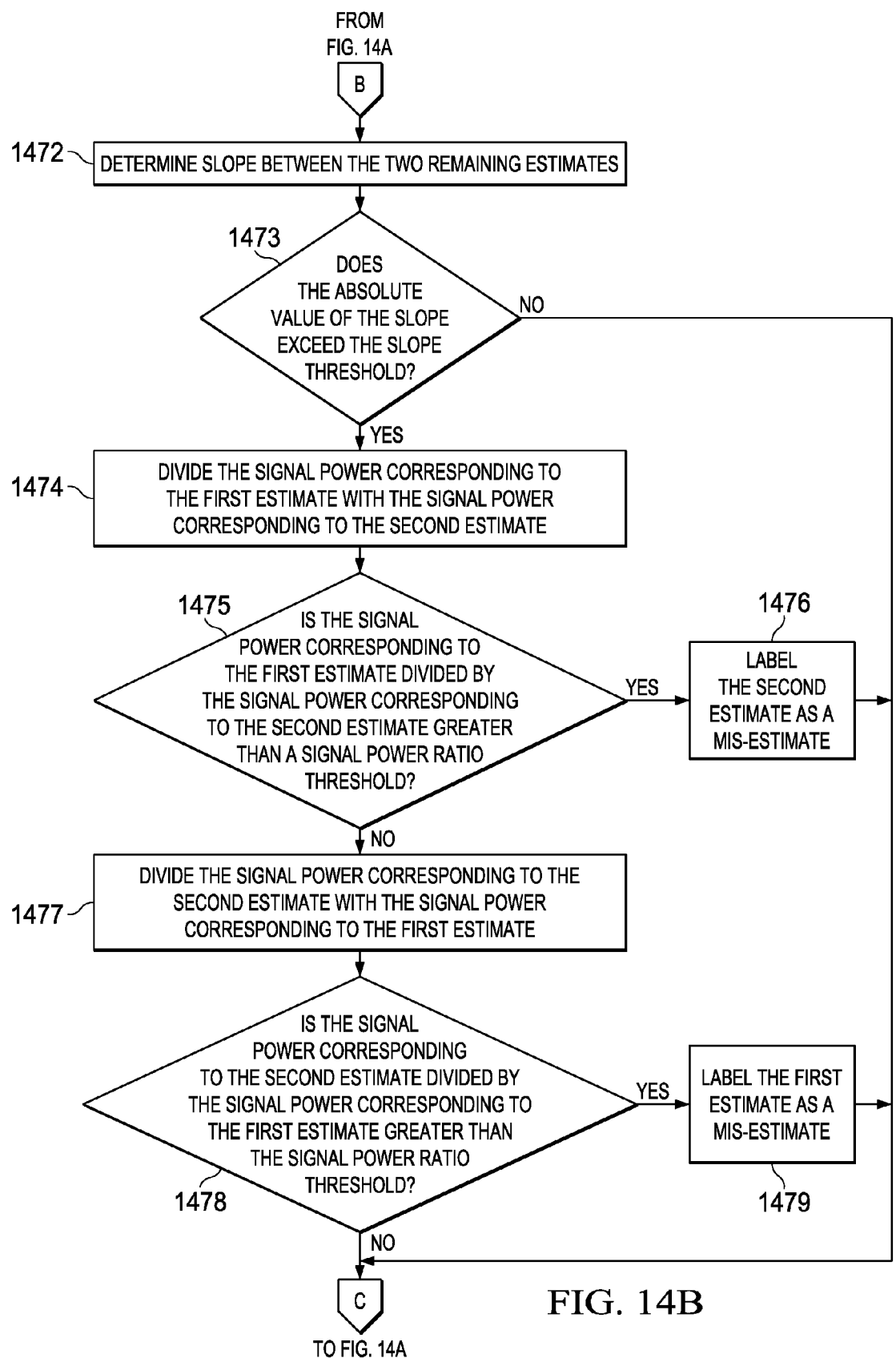

FIGS. 14A and 14B are a flowchart representative of example machine-readable instructions 1320 which, when executed, cause the example mis-estimation remover 270 of FIG. 2 to identify estimates as potential mis-estimates based on a slope validation. The example program 1320 of FIGS. 14A and 14B begins when the example slope calculator 410 identifies slopes between estimates identified by the filter 265 (Block 1410). In examples disclosed herein, the example slope calculator 410 calculates slopes between each estimate and all other estimates. However, in some examples, the example slope calculator 410 may calculate slopes between each estimate and nearby and/or adjacent estimates. For example, with respect to the illustrated example of FIG. 11, the example slope calculator identifies the slopes 1111, 1116, 1126, 1131, 1136, 1141 between the third estimate 1120 and each of the first estimate 1110, the second estimate 1115, the fourth estimate 1125, the fifth estimate 1130, the sixth estimate 1135, and the seventh estimate 1140. In the illustrated example of FIG. 11, the slope between the second estimate 1115 and the third estimate 1120 (e.g., slope 1116), the slope between the third estimate 1120 and the fourth estimate 1125 (e.g., slope 1126), and the slope between the third estimate 1120 and the fifth estimate 1130 (e.g., slope 1131) violate a slope threshold. In the illustrated example of FIG. 11, the slopes between other estimates (e.g., the slope between the first estimate 1110 and the sixth estimate 1135, the slope between the second estimate 1115 and the seventh estimate 1140, etc.) do not violate the slope threshold.

The example slope violation checker 420 prepares a count associated with each estimate identifying a number of slopes that are greater than the slope threshold (Block 1320). For example, with respect to the illustrated example of FIG. 11, the example slope violation checker 420 determines that the third estimate 1120 is associated with three slope violations, while the second slope estimate 1115, the fourth slope estimate 1125, and the fifth slope estimate are each associated with one slope violation (each in association with the third estimate 1120). The example slope violation checker 420 determines whether any estimates have a non-zero number of slope violations (Block 1430).

If there are estimates with slope violations (e.g., Block 1430 returns a result of YES), the example slope violation checker 420 determines whether there are more than two estimates remaining (Block 1440). If there are more than two estimates remaining (Block 1440 returns a result of YES), the example slope violation checker 420 selects the estimate having the greatest number of associated slope violations (Block 1450). For example, with reference to the illustrated example of FIG. 11, the third example estimate 1120 is associated with three slope violations. In some examples, multiple estimates may be identified as having the greatest number of slope violations. In such an example, each of the estimates identified as having the greatest number of slope violations are selected. The selected estimate(s) is/are then labeled as a potential mis-estimate(s) (Block 1460). The potential mis-estimate is removed from subsequent slope calculations (Block 1470). In other implementations, only one of the potential mis-estimates may be removed from subsequent slope calculations. The selection of the one to be removed may be based on the lowest signal power among the estimates or the highest uncertainty among the estimates. The example process of blocks 1410 through 1470 is then repeated until no estimates are identified as having slope violations (Block 1430 returns a result of NO). The example slope violation checker 420 then provides the estimates labeled as potential mis-estimates to the indication comparator 450 (Block 1480).

Returning to block 1440, if the example slope violation checker 420 determines that no more than two estimates are remaining (e.g., block 1440 returns a result of NO), the example slope violation checker 420 determines of exactly two estimates are remaining (Block 1471). If two estimates are remaining, one of those two estimates may be a mis-estimate. If there are not two estimates remaining (e.g., block 1471 returns a result of NO, indicating that either one or no estimates are remaining), the example slope violation checker 420 provides the estimates labeled as potential mis-estimates to the indication comparator 450 (Block 1480). If two estimates remain (e.g., block 1471 returns a result of YES), the example slope calculator 410 determines a slope between the two remaining estimates (Block 1472). The slope violation checker 420 determines whether the absolute value of the slope exceeds the slope threshold (e.g., the slope threshold used in association with block 1420) (Block 1473). However, in some examples, a second slope threshold different than the slope threshold (e.g., the slope threshold of block 1420) may be used. If the slope does not exceed the slope threshold (e.g., block 1473 returns a result of NO), the example slope violation checker 420 provides the estimates labeled as potential mis-estimates to the indication comparator 450 (Block 1480).

If the slope exceeds the slope threshold (e.g., block 1473 returns a result of YES), either the first remaining estimate or the second remaining estimate may be a mis-estimate. The example slope violation checker 420 divides a first signal power of the first remaining estimate by a second signal power of the second remaining estimate (Block 1474). In the illustrated example of FIG. 14B, signal power is used. However, any other property of the estimates may additionally or alternatively be used such as, for example, an inverse of the uncertainty of the estimates. The example slope violation checker 420 determines whether the first signal power divided by the second signal power is greater than a signal power ratio threshold. (Block 1475). If the first signal power divided by the second signal power is greater than the signal power ratio threshold, the example slope violation checker labels the second remaining estimate as the mis-estimate (Block 1476). If the first signal power divided by the second signal power is not greater than the signal power ratio threshold, (e.g., block 1475 returns a result of NO), the example slope violation checker 420 divides the second signal power by the first signal power (Block 1477). The example slope violation checker 420 determines whether the second signal power divided by the first signal power is greater than the signal power ratio threshold (Block 1478). If the second signal power divided by the first signal power is greater than the signal power ratio threshold (e.g., block 1478 returns a result of YES), the example slope violation checker 420 labels the first remaining estimate as the mis-estimate (Block 1479). If the second magnitude divided by the first signal power is not greater than the signal power ratio threshold (e.g., block 1478 returns a result of NO), control proceeds to block 1480, where the example slope violation checker 420 provides the estimates labeled as potential mis-estimates to the indication comparator 450 (Block 1480).

Figure 15:
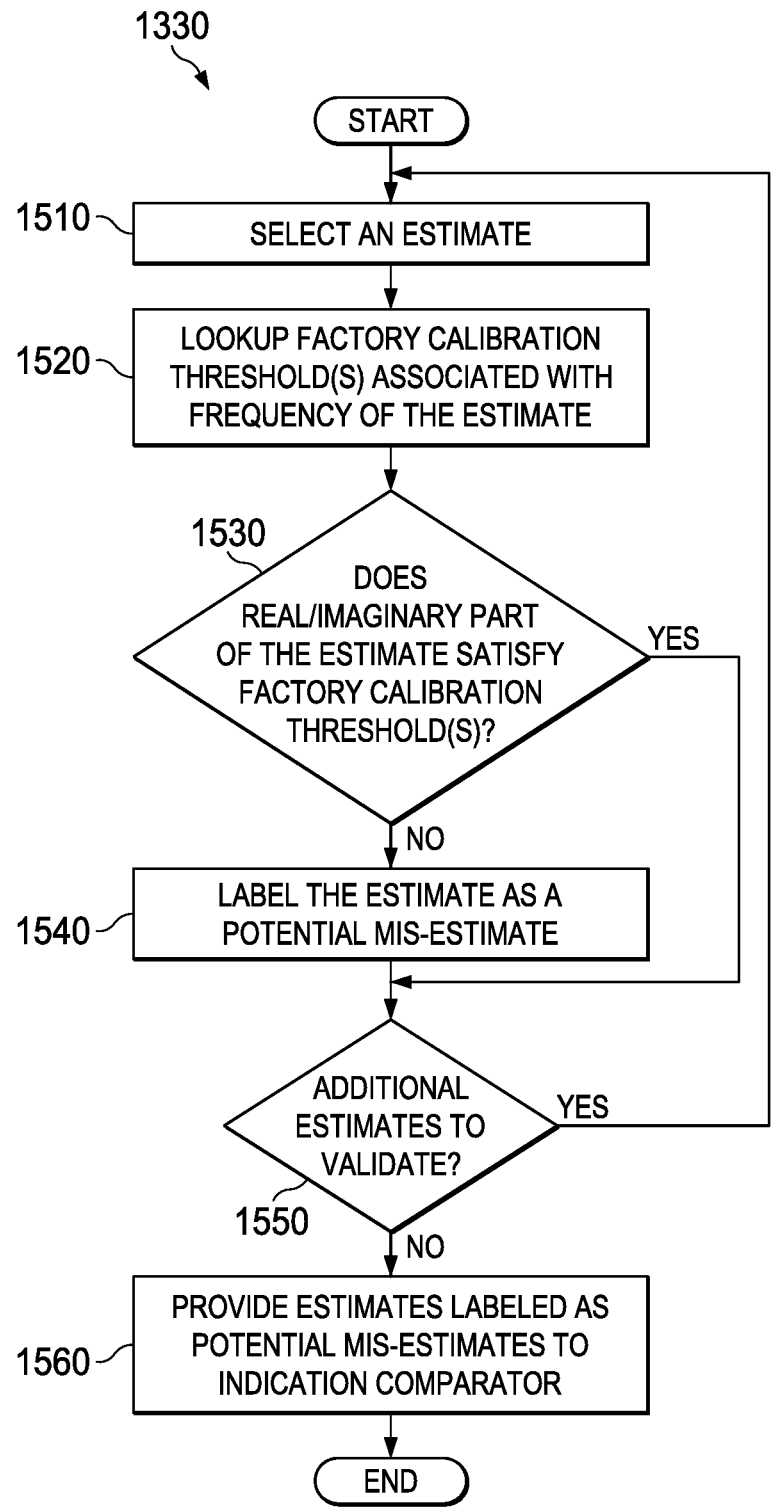
FIG. 15 is a flowchart representative of example machine-readable instructions which, when executed, cause the example mis-estimation remover of FIG. 2 to identify estimates as potential mis-estimates based on factory calibration data.

FIG. 15 is a flowchart representative of example machine-readable instructions 1330 which, when executed, cause the example mis-estimation remover 270 of FIG. 2 to identify estimates as potential mis-estimates based on factory calibration data. The example program 1330 of FIG. 15 begins when the example residue checker 440 selects an estimate to validate (Block 1510). Using the frequency of the selected estimation, the example residue checker 440 performs a lookup in the calibration data memory 430 (Block 1520).

The example residue checker 440 determines whether the real and/or imaginary part of the selected estimate is within a threshold range of a factory calibration threshold. In examples disclosed herein, the example calibration data memory 430 stores the factory calibration threshold in association with a frequency and/or a range of frequencies. As such, the example residue checker determines an acceptable real and/or imaginary part range bounded by a high threshold and a low threshold. In some examples, the example residue checker 440 considers delay as part of the threshold. For example, with reference to the illustrated example of FIG. 12, the example residue checker 440 identifies that the third estimate 1220 has a real and/or imaginary part greater than the high threshold 1255 for its respective frequency. With further reference to the illustrated example of FIG. 12, the example residue checker identifies that the first estimate 1210, the second estimate 1215, the fourth estimate 1225, the fifth estimate 1230, the sixth estimate 1235, and the seventh estimate 1240 are within the acceptable range for their respective frequencies.

In some examples, the example residue checker 440 evaluates an equation to determine whether the estimate should be considered an outlier. For example, Equation 1, below, may be evaluated by the example residue checker 440:

$$|G_i(k) - G_i^F(k)| < |g_{max} + j*2\pi*k*\Delta F*d_{max}|$$ Equation 1

In the illustrated example of Equation 1, k is a bin (e.g., a range of frequencies) in which the frequency of the estimate is included, $G_i(k)$ is the mismatch estimate, $G_i^F(k)$ is the factory calibrated estimate, $g_{max}$ is a gain variation threshold, $d_{max}$ is a delay threshold, $\Delta F$ is a frequency spacing between successive bins, and j is the square root of negative one.

In some examples, the evaluation may additionally or alternatively be performed in an H-domain such that the gain threshold ($g'_{max}$) and the delay threshold ($d'_{max}$) are both real. In examples disclosed herein, conversion to the H domain is performed using Equation 2, below.

$$H_l(k) = \sum_{i=0}^{M} G_i(K) * e^{\frac{j2il}{M}}$$ Equation 2

In the illustrated example of Equation 2, $G_0$ is selected such that $H_0$ is equal to zero. In such an example, the validation is performed using equation 3, below.

$$|H_l(k) - H_l^F(k)| < |g'_{max} + j*2\pi*k*\Delta F*d'_{max}|$$ Equation 3

If the example residue checker 440 identifies that the real and/or imaginary part does not satisfy the factory calibration thresholds (Block 1530 returns a result of NO), the selected estimate is labeled as a potential mis-estimate (Block 1540). If the example residue checker 440 identifies that the real and/or imaginary part satisfies the factory calibration thresholds (Block 1530 returns a result of YES), and/or upon the estimate being labeled as a potential mis-estimate (Block 1540), example residue checker 440 determines whether there are any additional estimates to validate (Block 1550). If there are additional estimates to validate (Block 1550 returns a result of YES), the example process of blocks 1510 through 1550 is repeated until all estimates are validated (e.g., until Block 1550 returns a result of NO). The example residue checker 440 then provides the estimates labeled as potential mis-estimates to the indication comparator 450 for comparison with the results of the slope validation performed by the slope calculator 410 and/or the slope violation checker 420 as described in FIG. 13 (Block 1560).

Figure 16:
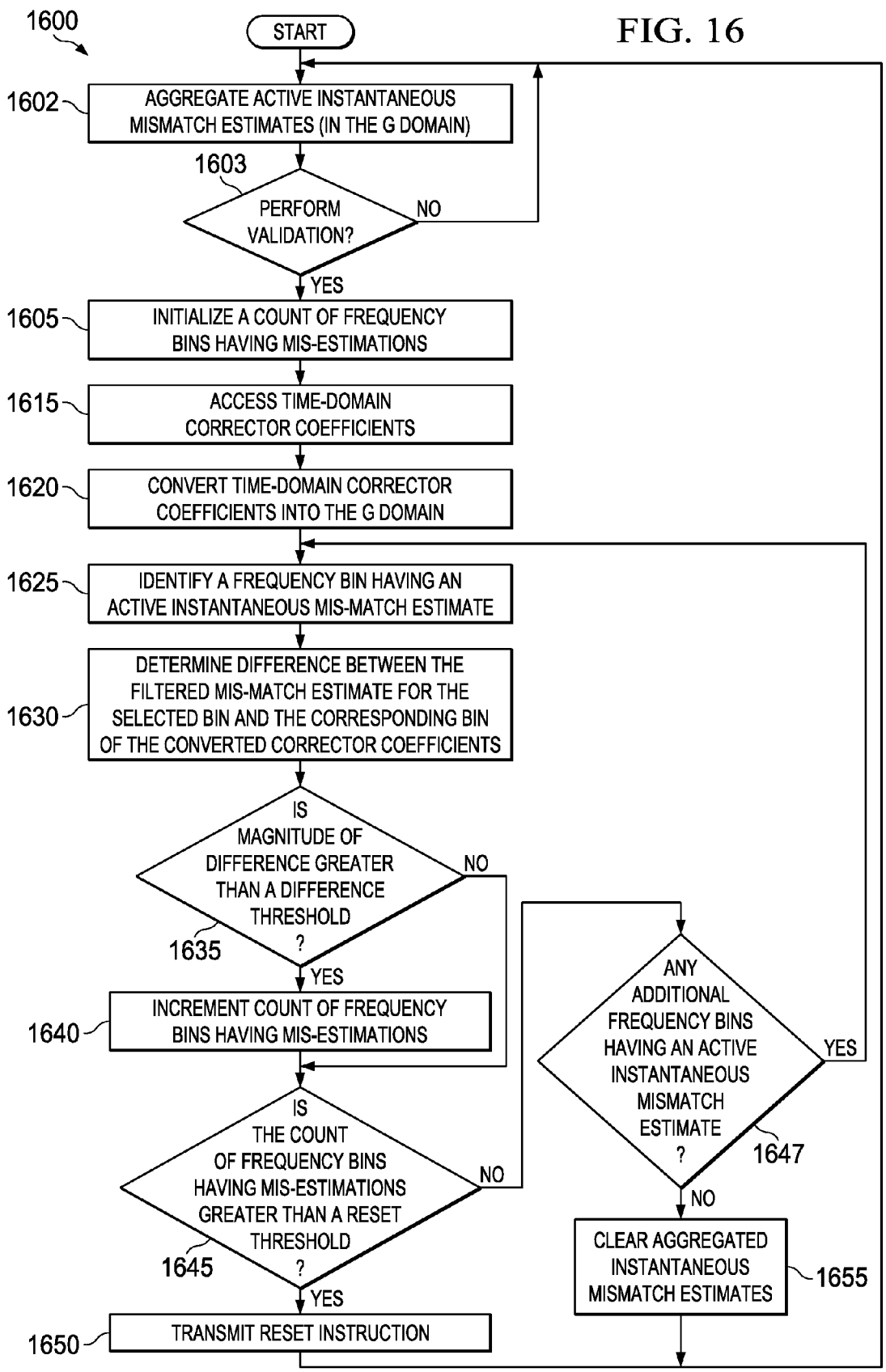
FIG. 16 is a flowchart representative of example machine-readable instructions which, when executed, cause the example mis-estimation recoverer of FIG. 2 to identify estimates that are no longer valid and remove those mis-estimations from the filter of FIG. 2.

FIG. 16 is a flowchart representative of example machine-readable instructions which, when executed, cause the example mis-estimation recoverer 280 of FIG. 2 to identify estimations that are no longer valid and remove those mis-estimations from the filter 265. Over time, frequency components of the signal processed by the interleaved ADC 100 may change. Moreover, bad estimates at some frequency bins can affect even good estimates in other bins because, for example, the corrector 170 typically has fewer taps than the number of bins for which there are estimates, and/or the number of FFT bins in general. As such, in some examples, bad estimates can corrupt good estimates in other bins due to equivalent interpolation in the frequency domain. As a result, what was once an accurate identification of an image resulting from the differences between the ADCs 100, 115, 120, 125 of the interleaved ADC 100 may, at a later time, no longer be accurate. The example mis-estimation recoverer 280 identifies prior estimates that may no longer be accurate and, as a result, removes those estimations from the filter 265.

The example program 1600 of FIG. 16 begins when the example active tone detector 530 aggregates active instantaneous mismatch estimates identified by the instantaneous mismatch estimator 260. (Block 1602). In examples disclosed herein, the example active tone detector 530 accesses the active estimates in the G domain that represents the mismatches due to input tones in the frequency domain. In some examples, the G domain is referred to as a frequency domain. However, the example active tone detector 530 may identify the active instantaneous mismatch estimates in any other fashion (e.g., in the time domain). The example active tone detector 530 determines whether validation should be performed. (Block 1603). In examples disclosed herein, the example active tone detector 530 periodically identifies that validation should be performed (e.g., every one hundred milliseconds). However, any other approach to triggering the validation performed by the mis-estimation recoverer 280 may additionally or alternatively be used such as, for example, an interrupt, upon calling of another function (e.g., a Kalman filter function), etc. If validation is not to be performed (e.g., block 1603 returns a result of NO), control proceeds to block 1602, where the active tone detector 530 continues to aggregate active instantaneous mismatch estimates identified by the instantaneous mismatch estimator 260. In this manner, the example process of blocks 1602 and 1603 is repeated until the example active tone detector 530 determines that validation is to be performed (e.g., block 1603 returns a result of YES). As noted below in connection with block 1655, at the end of each validation operation, the aggregated instantaneous mismatch estimates are cleared. (Block 1655). In this manner, the instantaneous mismatch estimates aggregated in connection with block 1602 represent mismatches identified since the prior iteration of the validation operation (e.g., up to the prior one hundred milliseconds).

To perform the validation, the example mis-estimation detector 520 initializes a count of frequency bins having mis-estimations (Block 1605). The example frequency domain converter 510 accesses time-domain corrector coefficients from the time domain converter 295 (Block 1615). The example frequency domain converter 510 converts the time-domain corrector coefficients into the G domain (Block 1620). In examples disclosed herein, the example frequency domain converter 510 implements a fast Fourier transform (FFT). However, any other approach to converting from the time domain to the G domain may additionally or alternatively be used.

The example mis-estimation detector 520 identifies a frequency bin having an active instantaneous mismatch estimate (identified by the active tone detector 530 in Block 1610) (Block 1625). In examples disclosed herein, frequency bins are identified as active when they have appeared in an output of the instantaneous mismatch estimator 260 since a previous iteration of the execution of the example process 1600 of FIG. 16 (e.g., are included in the instantaneous mismatch estimates aggregated in connection with block 1602). The example mis-estimation detector 520 determines a difference between the filtered mismatch identified by the active tone detector 530 for the selected frequency bin and a corresponding converted mismatch for the corrector coefficients (e.g., the coefficients identified by the frequency domain converter 510 in Block 1620) (Block 1630).

The example mis-estimation detector 520 determines whether the magnitude of difference between them is greater than a difference threshold (Block 1635). In examples disclosed herein, the example difference is −70 decibels. However, any other difference threshold may alternatively be used. If the difference between the magnitudes is greater than the difference threshold (Block 1635 returns a result of YES), the example mis-estimation detector 520 identifies the frequency bin as having a mis-estimate and increments a count of frequency bins having mis-estimations (Block 1640). The example mis-estimation detector 520 determines if the count of frequency bins having mis-estimations is greater than a reset threshold (Block 1645). In examples disclosed herein, the reset threshold is three frequency bins having mis-estimations. However, any other threshold may additionally or alternatively be used.

If the count of frequency bins having mis-estimations is not greater than the reset threshold (Block 1645 returns a result of NO), the example mis-estimation recoverer 280 determines whether there are any additional frequency bins having an active instantaneous mismatch estimate (e.g., frequency bins having active instantaneous mismatch estimates that have not yet been processed). (Block 1647). If additional frequency bins having an active instantaneous mismatch estimate exist (e.g., block 1647 returns a result of YES), the example mis-estimation recoverer 280 continues to compare the aggregated active filtered mismatches (aggregated in connection with block 1602) to mismatches output from the time domain converter 295 The example process of blocks 1625 through 1645 is repeated until the count of frequency bins having mis-estimations is greater than the reset threshold (Block 1645 returns a result of YES.) If no additional frequency bins having an active instantaneous mismatch estimate exist (e.g., block 1647 returns a result of NO), control proceeds to block 1655, where the example active tone detector 530 clears the aggregated instantaneous mismatch estimates. (Block 1655). The example process of block 1602 and 1603 is repeated until a subsequent validation is to be performed (e.g., in one hundred milliseconds).

Returning to block 1645, upon determining that the count of frequency bins having mis-estimations is greater than the reset threshold (Block 1645 returns a result of YES), the example resetter 540 transmits a reset instruction to the filter 265 to remove mis-estimations from the filter 265 (Block 1650). In examples disclosed herein, the example resetter 540 instructs the filter 265 to remove all current filtered mismatch estimates and, instead, use only mismatch estimates identified by the instantaneous mismatch estimator 260, resulting in complete reset. However, in some examples, the example resetter 540 instructs the filter 265 to remove particular filtered mismatch estimates (e.g., inactive filtered mismatch estimates), resulting in a partial reset. Control then proceeds to block 1655, where the example active tone detector 530 clears the aggregated instantaneous mismatch estimates. (Block 1655). The example process of block 1602 and 1603 is repeated until a subsequent validation is to be performed (e.g., in one hundred milliseconds).

Figure 17:
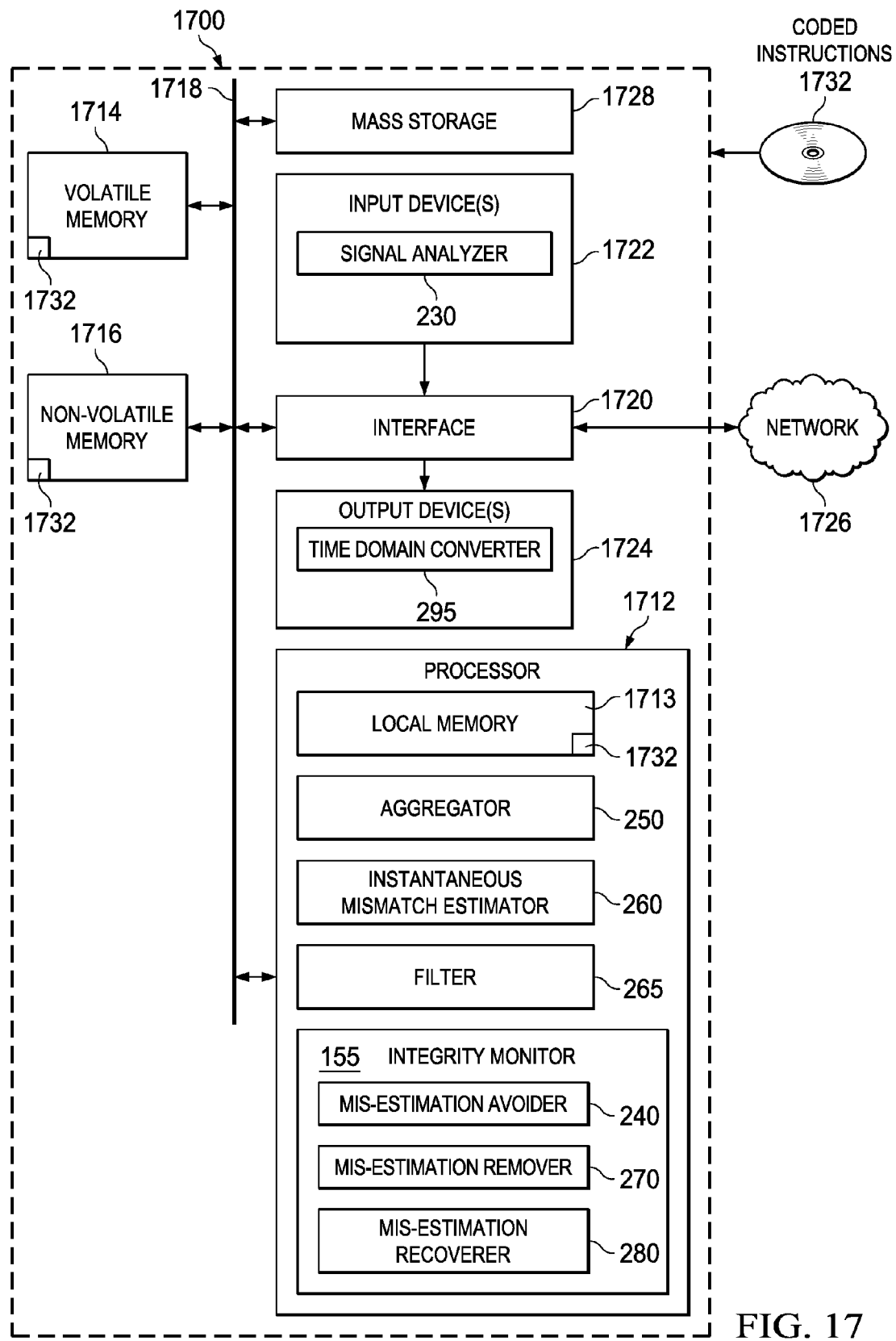
FIG. 17 is a block diagram of an example processor platform capable of executing the instructions of FIGS. 6, 7, 13, 14A, 14B, 15, and/or 16 to implement the example frequency domain mismatch estimator of FIG. 2.

FIG. 17 is a block diagram of an example processor platform 1700 capable of executing the instructions of FIGS. 6, 7, 13, 14A, 14B, 15, and/or 16 to implement the example frequency domain mismatch estimator of FIG. 2. The processor platform 1700 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1700 of the illustrated example includes a processor 1712. The processor 1712 of the illustrated example is hardware. For example, the processor 1712 can be implemented by one or more integrated circuits, logic circuits, microprocessors or controllers from any desired family or manufacturer.

The processor 1712 of the illustrated example includes a local memory 1713 (e.g., a cache). In some examples, the processor 1712 of the illustrated example of FIG. 17 executes instructions to implement the example aggregator 250, the example instantaneous mismatch estimator 260, the example filter 265 of FIG. 2. Moreover, in some examples, the processor 1712 of the illustrated example of FIG. 17 executes instructions to implement the example mis-estimation avoider 240, the example mis-estimation remover 270, the example mis-estimation recoverer 280, and/or more generally, the example integrity monitor of FIGS. 1 and/or 2. The processor 1712 of the illustrated example is in communication with a main memory including a volatile memory 1714 and a non-volatile memory 1716 via a bus 1718. The volatile memory 1714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1716 may be implemented by flash memory and/or any other desired type of memory device. Access to the main memory 1714, 1716 is controlled by a memory controller.

The processor platform 1700 of the illustrated example also includes an interface circuit 1720. The interface circuit 1720 may be implemented by any type of interface standard, such as an Ethernet interface, a universal serial bus (USB), and/or a PCI express interface.

In the illustrated example, one or more input devices 1722 are connected to the interface circuit 1720. The input device(s) 1722 permit(s) a user to enter data and commands into the processor 1712. The input device(s) can be implemented by, for example, a keyboard, a button, a mouse, etc. In some examples, the example input device 1722 implements the example signal analyzer 230 of FIG. 2.

One or more output devices 1724 are also connected to the interface circuit 1720 of the illustrated example. The output devices 1724 can be implemented, for example, by general purpose input/output pins, display devices (e.g., a light emitting diode (LED), an organic light emitting diode (OLED), a liquid crystal display, etc.). The interface circuit 1720 of the illustrated example, thus, typically includes a graphics driver card, a graphics driver chip or a graphics driver processor. In some examples, the example output device 1724 implements the example time domain converter 295 of FIG. 2.

The interface circuit 1720 of the illustrated example also includes a communication device such as a transmitter, a receiver, a transceiver, a modem and/or network interface card to facilitate exchange of data with external machines (e.g., computing devices of any kind) via a network 1726 (e.g., an Ethernet connection, a digital subscriber line (DSL), a telephone line, coaxial cable, a cellular telephone system, etc.).

The processor platform 1700 of the illustrated example also includes one or more mass storage devices 1728 for storing software and/or data. Examples of such mass storage devices 1728 include floppy disk drives, hard drive disks, compact disk drives, Blu-ray disk drives, RAID systems, and digital versatile disk (DVD) drives.

The coded instructions 1732 of FIGS. 6, 7, 13, 14A, 14B, 15, and/or 16 may be stored in the mass storage device 1728, in the volatile memory 1714, in the non-volatile memory 1716, and/or on a removable tangible computer readable storage medium such as a CD or DVD.

From the foregoing, it will be appreciated that the above disclosed methods, apparatus, and articles of manufacture enable an increase in the signal integrity of an interleaved analog to digital converter. For example, by avoiding mis-estimations using the example mis-estimation avoider 2 of FIG. 2, the example instantaneous mismatch estimator 260 of FIG. 2 will correctly identify spurs resulting from mismatched characteristics of the ADCs of the interleaved ADC. Likewise, the example mismatch estimator 260 of FIG. 2 will be less likely to incorrectly identify spurs resulting from the mismatched characteristics of the ADCs of the interleaved ADC.

Further still, the example mis-estimation remover 270 and/or the example mis-estimation recoverer 280 of the illustrated example of FIG. 2 identify when the example mismatch estimator 260 has incorrectly identified a spur (e.g., identified a spur when none was present). Such mis-estimations can be removed accordingly, thereby preserving the integrity of the ADC signal produced by the interleaved ADC.

Such improved accuracy of the interleaved ADC enables high speed interleaved ADCs that operate in excess of, for example, one billion samples per second. Such sampling rates are useful in fields such as the communication industry to facilitate high bandwidth data acquisition and/or transmission.

It is noted that this patent claims priority from Indian Provisional Patent Application No. 2557/CHE/2015, which was filed on May 22, 2015 and was entitled "INTEGRITY MONITOR AND CONTROL FOR ROBUST MISMATCH ESTIMATION AND CORRECTION IN AN INTERLEAVED ADC," which is hereby incorporated by reference in its entirety.

Although certain example methods, apparatus, and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
an instantaneous mismatch estimator that uses an output of an interleaved analog to digital converter configured to identify a mismatch estimate between two or more component analog to digital converters of the interleaved analog to digital converter, wherein the mismatch estimate is provided to a filter; and
an integrity monitor configured to analyze the mismatch estimate to determine whether the mismatch estimate is inaccurate and, in response to determining that the mismatch estimate provided to the filter as inaccurate, providing an instruction to the filter to remove the mismatch estimate.

2. The apparatus of claim 1, wherein the integrity monitor includes a misestimation avoider configured to provide an input to the instantaneous mismatch estimator, wherein the input represents a signal to image power threshold.

3. The apparatus of claim 1, further comprising:
a signal analyzer configured to analyze an output of the interleaved analog to digital converter to create a frequency domain representation of the output;
an aggregator configured to aggregate the frequency domain representation to create an aggregated frequency domain representation, wherein the instantaneous mismatch estimator is configured to estimate the interleaving mismatch using the aggregated frequency domain representation; and
the filter configured to store and filter the mismatch estimate, the filter further configured to provide stored mismatch estimates to a corrector to enable correction of the output of the interleaved analog to digital converter.

4. The apparatus of claim 3, wherein the integrity monitor includes a misestimation avoider configured to provide a validity flag to the aggregator, the validity flag indicates whether a component of the frequency domain representation is to be excluded from the aggregated frequency domain representation.

5. The apparatus of claim 1, wherein the integrity monitor further comprises a mis-estimation remover configured to determine the mismatch estimate as inaccurate when the mismatch estimate is different from a factory determined or pre-determined nominal mismatch estimate by more than an error threshold.

6. The apparatus of claim 5, wherein the error threshold is based on a frequency corresponding to the mismatch estimate.

7. The apparatus of claim 5, wherein the mis-estimation remover is further configured to determine the mismatch estimate as being inaccurate when the mismatch estimate is associated with a maximum number of occurrences of slopes being greater than a slope threshold with respect to other mismatch estimates stored in the filter.

8. The apparatus of claim 1, wherein the integrity monitor further comprises a mis-estimation remover configured to determine the mismatch estimate as being inaccurate when the mismatch estimate is associated with a maximum number of occurrences of slopes being greater than a slope threshold with respect to other mismatch estimates stored in the filter.

9. The apparatus of claim 1, wherein the integrity monitor further comprises a mis-estimation recoverer configured to compare a first mismatch correction with a second mismatch correction obtained from a mismatch correction generator, the second mismatch correction having a same frequency characteristics as the first mismatch correction, the mis-estimation recoverer further configured to cause the filter to remove a subset of its filtered mismatch estimates when a difference between the first mismatch correction and the second mismatch correction exceeds a difference threshold.

10. A method to correct a mismatch in an interleaved analog to digital converter, the method comprising:
identifying a mismatch estimate between two or more component analog to digital converters of the interleaved analog to digital converter, the mismatch estimate identified based on an output the interleaved analog to digital converter;
storing and filtering the mismatch estimate in a filter;
analyzing the mismatch estimate stored in the filter to determine whether the mismatch estimate is inaccurate; and
in response to determining the mismatch estimate stored in the filter as inaccurate, removing the mismatch estimate from the filter.

11. The method of claim 10, further comprising:
creating a frequency domain representation of the output of the interleaved analog to digital converter; and
aggregating the frequency domain representation to create an aggregated frequency domain representation, wherein the identifying of the mismatch estimate is further based on the aggregated frequency domain representation.

12. The method of claim 11, further comprising
excluding a component of the frequency domain representation from the aggregated frequency domain representation when a signal to image ratio of the component is less than or equal to a signal to image ratio threshold.

13. The method of claim 12, wherein the signal to image ratio threshold is determined based on a power in an image band divided by a power in a signal band.

14. The method of claim 10, further comprising
determining the mismatch estimate as inaccurate when the mismatch estimate is different from a factory determined or pre-determined nominal mismatch estimate by more than an error threshold.

15. The method of claim 14, further comprising
determining the mismatch estimate as inaccurate when the mismatch estimate is associated with a maximum number of occurrences of slopes being greater than a slope threshold with respect to other mismatch estimates stored in the filter.

16. The method of claim 10, further comprising
comparing a first mismatch correction to a second mismatch correction obtained from a mismatch correction generator, the second mismatch correction having a same frequency characteristics as the first mismatch correction; and
removing a subset of mismatch estimates from the filter when a difference between the first mismatch correction and the second mismatch correction exceeds a difference threshold.

17. A tangible machine readable storage medium comprising instructions which, when executed, cause a machine to:
identify a mismatch estimate between two or more component analog to digital converters of an interleaved analog to digital converter, the mismatch estimate identified based on an output of the interleaved analog to digital converter;
store and filter the mismatch estimate in a filter;
analyze the mismatch estimate stored in the filter to determine the mismatch is inaccurate; and
in response to determining the mismatch estimate stored in the filter as inaccurate, remove the mismatch estimate from the filter.

18. The tangible machine readable storage medium of claim 17, wherein the instructions, when executed, further cause the machine to:
create a frequency domain representation of an output of an interleaved analog to digital converter; and
aggregate the frequency domain representation to create an aggregated frequency domain representation, wherein the identifying of the mismatch estimate is further based on the aggregated frequency domain representation.

19. The tangible machine readable storage medium of claim 17, wherein the instructions, when executed, further cause the machine to exclude a component of the frequency domain representation from the aggregated frequency domain representation when a signal to image ratio of the component is less than or equal to a signal to image ratio threshold.

20. The tangible machine readable storage medium of claim 19, wherein the signal to image ratio threshold is determined based on a power in an image band divided by a power in a signal band.

21. The tangible machine readable storage medium of claim 17, wherein the instructions, when executed, further cause the machine to determine the mismatch estimate as inaccurate when the mismatch estimate is different from a factory determined or pre-determined nominal mismatch estimate by more than an error threshold.

22. The tangible machine readable storage medium of claim 17, wherein the instructions, when executed, further cause the machine to determine the mismatch estimate as inaccurate when the mismatch estimate is associated with a maximum number of occurrences of slopes being greater than a slope threshold with respect to other mismatch estimates stored in the filter.

23. The tangible machine readable storage medium of claim 17, wherein the instructions, when executed, further cause the machine to:
   compare a first mismatch correction to a second mismatch correction obtained from a mismatch correction generator, the second mismatch correction having a same frequency characteristics as the first mismatch correction; and
   remove a subset of mismatch estimates from the filter when a difference between the first mismatch correction and the second mismatch correction exceeds a difference threshold.

* * * * *